United States Patent
Imai et al.

(10) Patent No.: US 8,700,947 B2
(45) Date of Patent: Apr. 15, 2014

(54) CACHE MEMORY APPARATUS, EXECUTION PROCESSING APPARATUS AND CONTROL METHOD THEREOF

(75) Inventors: Hiroyuki Imai, Kawasaki (JP); Naohiro Kiyota, Kawasaki (JP); Tsuyoshi Motokurumada, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 1159 days.

(21) Appl. No.: 12/636,619

(22) Filed: Dec. 11, 2009

(65) Prior Publication Data

US 2010/0088550 A1   Apr. 8, 2010

Related U.S. Application Data

(63) Continuation of application No. PCT/JP2007/000663, filed on Jun. 20, 2007.

(51) Int. Cl.
*G06F 11/00* (2006.01)

(52) U.S. Cl.
USPC ........................................................ 714/6.11

(58) Field of Classification Search
USPC .................................... 714/42, 6.11; 711/144
See application file for complete search history.

(56) References Cited

U.S. PATENT DOCUMENTS

| | | | |
|---|---|---|---|
| 6,006,311 A * | 12/1999 | Arimilli et al. | 711/133 |
| 6,289,438 B1 | 9/2001 | Takayanagi | |
| 6,339,813 B1 * | 1/2002 | Smith et al. | 711/144 |
| 6,708,294 B1 | 3/2004 | Nakao et al. | |
| 6,918,071 B2 | 7/2005 | Cherabuddi et al. | |
| 2003/0191885 A1 | 10/2003 | Thimmanagari et al. | |
| 2004/0025095 A1 | 2/2004 | Nemani et al. | |
| 2005/0132263 A1 * | 6/2005 | Anderson et al. | 714/766 |
| 2006/0080572 A1 | 4/2006 | Fong | |
| 2008/0163029 A1 | 7/2008 | Hirano et al. | |
| 2008/0294847 A1 | 11/2008 | Maruyama et al. | |
| 2008/0294961 A1 | 11/2008 | Hirano | |

FOREIGN PATENT DOCUMENTS

| | | |
|---|---|---|
| EP | 1 990 727 A1 | 11/2008 |
| JP | 52-15236 | 2/1977 |
| JP | 60-123949 | 7/1985 |
| JP | 1-292454 | 11/1989 |

(Continued)

OTHER PUBLICATIONS

Notice of Rejection Ground for Japanese Application No. 2009-520146; mailed Aug. 3, 2010.

(Continued)

*Primary Examiner* — Yair Leibovich
(74) *Attorney, Agent, or Firm* — Staas & Halsey LLP

(57) ABSTRACT

A cache memory apparatus is configured to include a data holding unit comprising a plurality of ways that has a plurality of cache lines; an alternation data register to hold data in one line of the cache lines or in a part of the cache lines; an alternation address register to hold an index address that indicates a faulty cache line and a part in which the fault has occurred in the faulty cache line; an alternation way register to hold information of a way including the part having a fault; an address match circuit comparing, when an access is performed to the data holding unit, an index address and the index address held by the alternation address register; and a way match circuit comparing, when an access is performed to the data holding unit, way information used for the access and way information held by the alternation way register.

17 Claims, 25 Drawing Sheets

(56) References Cited

FOREIGN PATENT DOCUMENTS

| | | |
|---|---|---|
| JP | 2-93745 | 4/1990 |
| JP | 4-239936 | 8/1992 |
| JP | 6-131897 | 5/1994 |
| JP | 7-295883 | 11/1995 |
| JP | 10-333982 | 12/1998 |
| JP | 11-282764 | 10/1999 |
| JP | 2001-147859 | 5/2001 |
| JP | 2003-203010 | 7/2003 |
| JP | 3483296 | 10/2003 |
| JP | 2006-343851 | 12/2006 |
| JP | 2008-165449 | 7/2008 |
| WO | 2007/094045 A1 | 8/2007 |
| WO | 2007/097026 A1 | 8/2007 |

OTHER PUBLICATIONS

International Search Report issued Dec. 11, 2007 in corresponding PCT/JP2007/000663.

Extended European Search Report dated Jun. 22, 2012 issued in corresponding European Patent Application No. 07790189.0.

John Y. Fong et al., "Nonvolatile Repair Caches Repair Embedded SRAM and New Nonvolatile Memories", Proceedings of the 19th IEEE International Symposium on Defect and Fault Tolerance in VLSI Systems, 2004, pp. 1-10.

\* cited by examiner

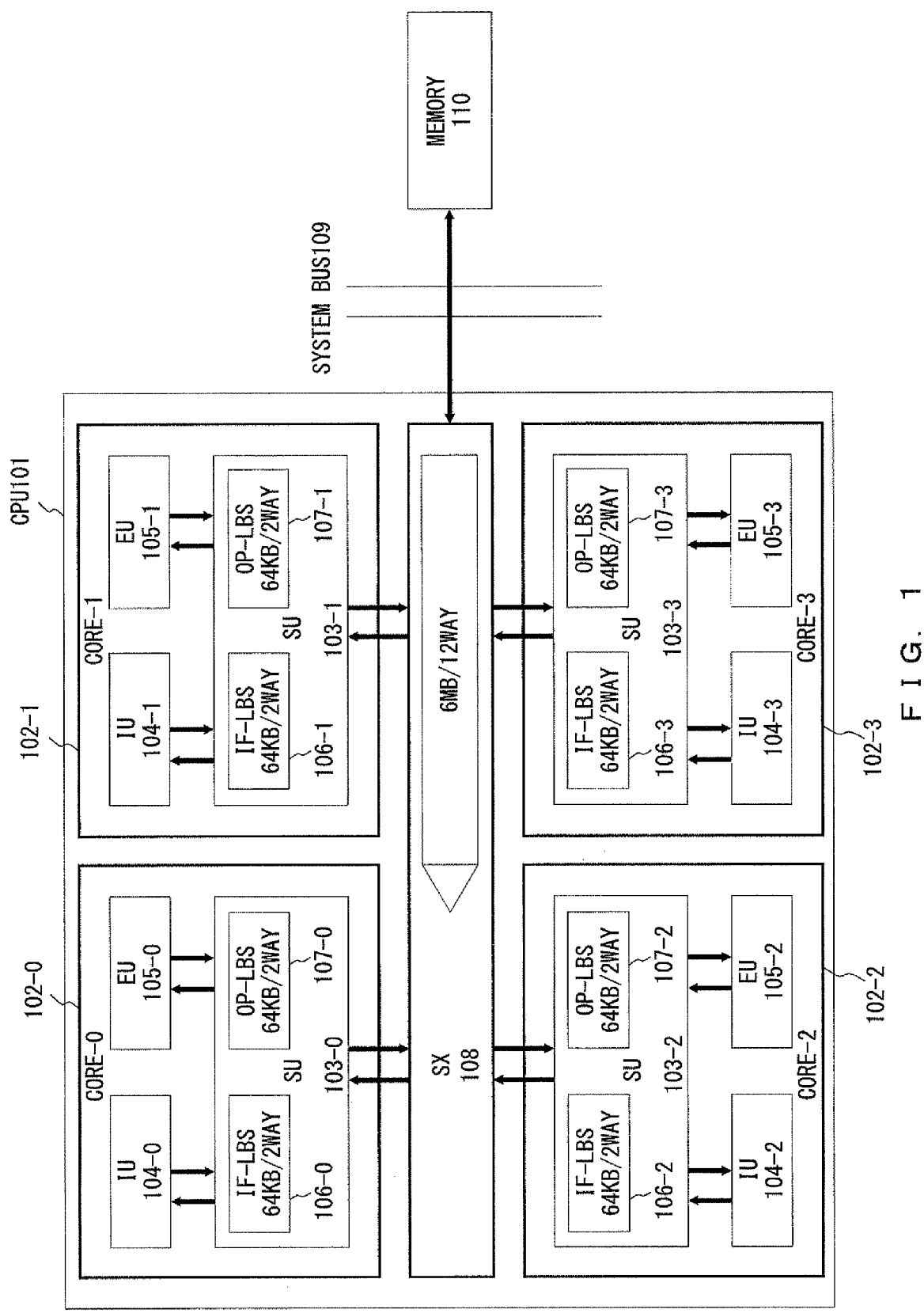
F I G. 1

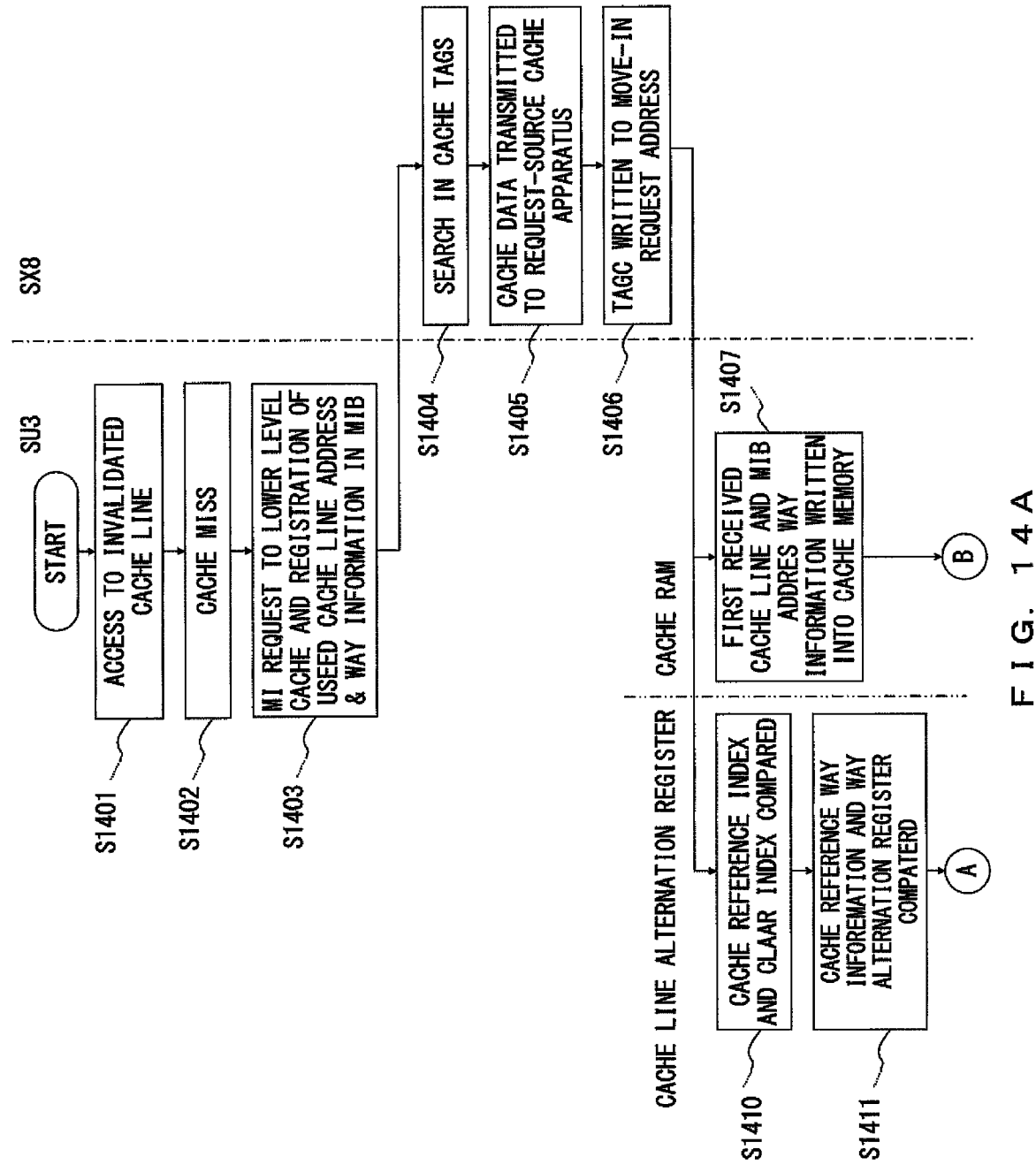
F I G. 14A

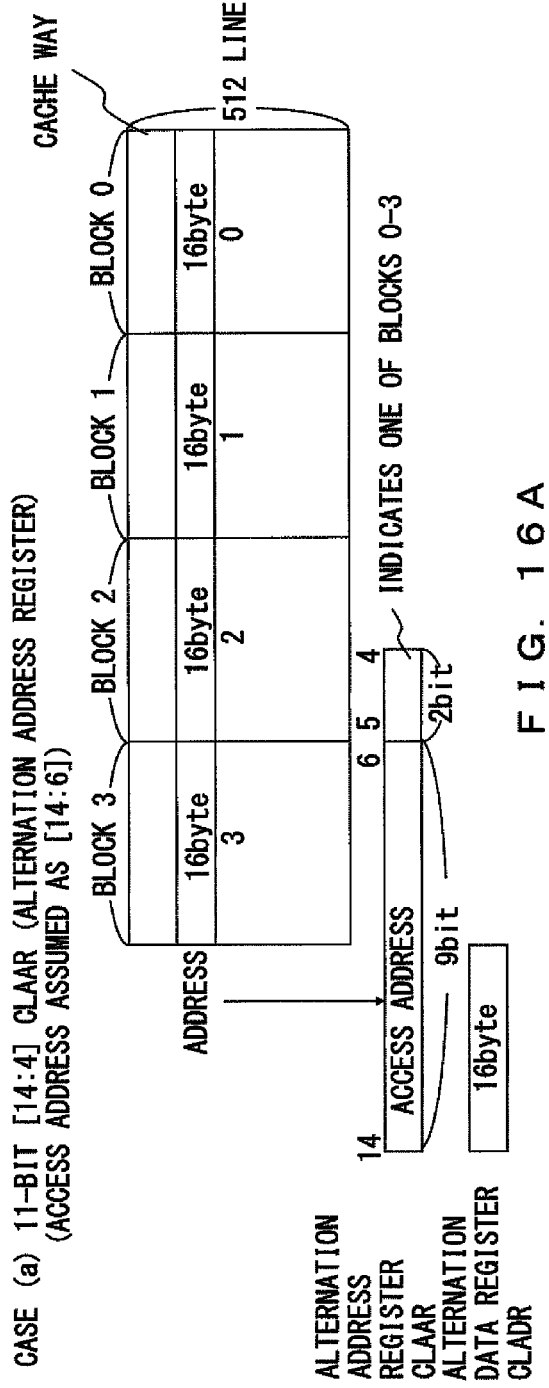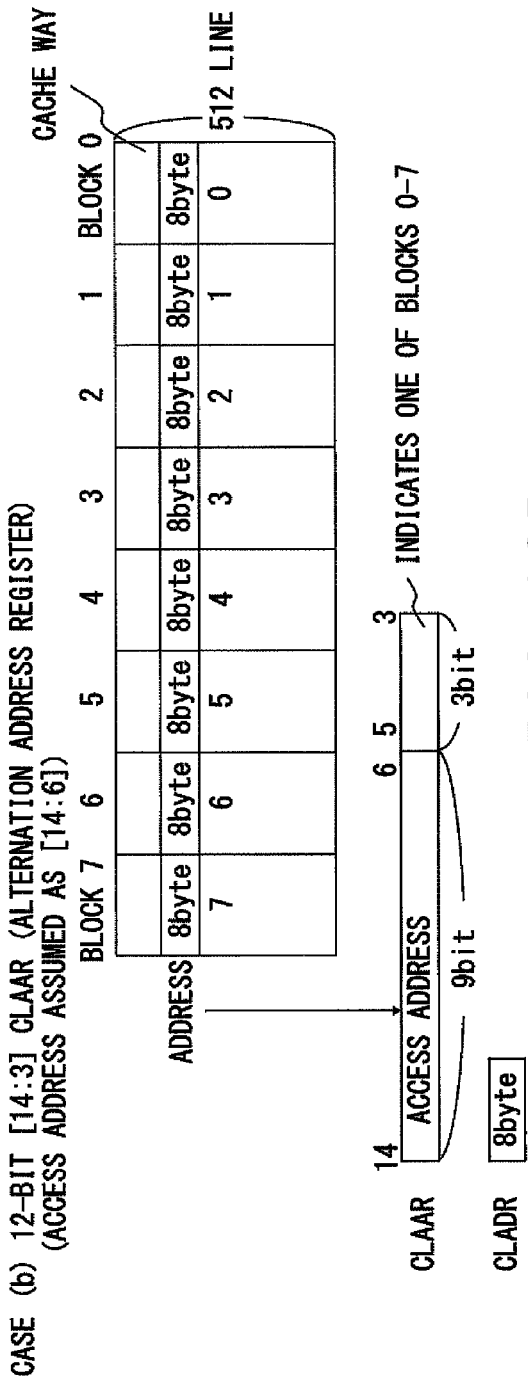

| NUMBER OF ADDRESS BITS HELD BY CLAAR | ALTERNATION DATA [LINE] | QUANTITATIVE PATTERN DIAGRAM OF REGISTER |
|---|---|---|
| 9 (CONVENTIONAL EXAMPLE) | 1 (64byte) | ▇ |
| 10 (PRESENT EMBODIMENT) | 1/2 (32byte) | ▇ |
| 11 | 1/4 (16byte) | ▇ |
| 12 | 1/8 (8byte) | ▪ |
| ... | ... | ... |
| 15 | 1/64 (1byte) | ▁ |

F I G. 1 7

CACHE MEMORY APPARATUS, EXECUTION PROCESSING APPARATUS AND CONTROL METHOD THEREOF

CROSS-REFERENCE TO RELATED APPLICATIONS

This application is a continuation of PCT application PCT/JP2007/000663, which was filed on Jun. 20, 2007, the entire contents of which are incorporated herein by reference.

FIELD

The present invention relates to a cache memory apparatus having a cache line alternation register rescuing a fault occurring in a cache line, an execution processing apparatus and a control method thereof.

BACKGROUND

Block degeneracy and WAY degeneracy have been used as rescue processes for a permanent fault in a conventional cache memory. In the block degeneracy and WAY degeneracy, the number of faults in a cache memory is observed in units of WAYs of the cache memory, and when the number of fault occurring in a unit time exceeds a predetermined threshold value, the cut off of the block or the WAY is performed. The function to cut off the cache line and its WAY that were faulty when the threshold value was exceeded for the first time is called block degeneracy. In the block degeneracy, data corresponding to one line are cut off. When a fault also occurs in data other than that in the cache line subjected to the block degeneracy, the subject of the block degeneracy is switched to the cache line and WAY in which the last fault occurred. In other words, the objective of the rescue for a fault by the block degeneracy is the protection of data corresponding to one line in a cache memory, and when a fault is occurring in a plurality of cache lines, the number of fault in a cache memory keeps increasing after the occurrence of the block degeneracy, and when it reaches a predetermined value, the WAY having the fault is cut off. When the WAY degeneracy occurs, the processor can continue the operation, but there is a significant decline in the performance. Therefore, the extent of the performance decline is reduced by inducing, before the WAY degeneracy, the block degeneracy in which only one cache line is cut off.

However, when the cache memory has a small storage capacity, the performance decline due to the loss of one cache line cannot be disregarded, and the faulty chip needs to be replaced even with the occurrence of the block degeneracy. In the case of a CPU having a plurality of cores, it is impossible to replace only the core subjected to the block degeneracy due to a one-bit permanent fault, so the replacement is to be performed in units of chips including other cores that are operating normally. Since there has been a trend in the recent CPU development to increase the number of cores to be mounted on a chip while reducing the capacity of the first level cache memory, the conventional fault-protection mechanism for a cache memory by means of the block degeneracy increases the possibility that cores that have not been faulty become the target of replacement meaninglessly. As a result, the conventional rescue process by means of the block degeneracy had insufficient fault resistance in units of CPU chips.

In this regard, a method was invented, for rescuing a one-bit permanent fault without losing a cache line by disposing a cache line alternation register for registering, when a one-bit permanent fault happens, cache data of the faulty line to replace the data in the line having the one-bit permanent fault (Patent document 1).

To implement the cache line alternation register, in the system that has been adopted conventionally, the physical address is used for the comparison of the alternation-target addresses, and when they match, the data in the cache line alternation register are read out. Since the physical address has a large number of bits, the address processing takes time. In addition, in order to obtain the physical address to be the target of the comparison, there is a need for referring to TLB (Translation Look-aside Buffer) and a cache tag. For this reason, while it has been possible to use the cache line alternation register in reading out from the cache memory, in the writing-in into the cache memory, the flow of the reference comparison of the TLB and cache tag and the writing-in significantly deviates from the normal cache-control flow, so the use of the cache line alternation resister has been abandoned. In other words, every time the cache alternation register becomes the store target, for example, the cache line alternation register was invalidated and the operation was restarted from the reference to the main memory, causing some performance decline with the store operation.

In addition, the conventional cache line alternation register has been configured to be able to replace all the bits in one cache line. However, in practice, the chances that a one-bit error occurs at a plurality of places in one cache line are low, making the use of circuit resources being not very efficient.

Therefore, the present invention proposes a cache line alternation register in a new configuration that solves the problems with the conventional cache line alternation register.

Then, first, the configuration of a conventional cache without the cache line alternation register of the present invention is explained. Since the configuration of the present invention is realized by adding the function to partly replace the operation of the conventional cache that is not equipped with the cache line alternation register, the configuration of the conventional cache needs to be clarified.

FIG. 1 illustrates the configuration of a conventional CPU.

A CPU 101 illustrated in FIG. 1 has four cores CORE-0 (102-0), CORE-1 (102-1), CORE-2 (102-2, CORE-3 (102-3) (hereinafter, CORE is referred to as 102).

Each core CORE 102 has IUs (Instruction Unit) (104-0, 104-1, 104-2, 104-3: hereinafter, IU is referred to as 104), EUs (Execution Unit) (105-0, 105-1, 105-2, 105-3: hereinafter, EU is referred to as 105), and SUs (Storage Unit) (103-0, 103-1, 103-2, 103-3: hereinafter, SU is referred to as 103).

Further, the SUs (103) respectively have IF-LBSs (Instruction Fetch Local Buffer Storage) (106-0, 106-1, 106-2, 106-3: hereinafter, IF-LBS is referred to as 106) that are instruction caches, and OP-LBSs (Operand Local Buffer Storage) (107-0, 107-1, 107-2, 107-3: hereinafter, OP-LBS is referred to as 107) that are operand caches.

In addition, the CPU 101 has an SX (Second Cache) 108 that is a second level cache, which performs data communication with the respective cores CORE 102, and the SX 108 further performs data communication with a Memory 110 that is the main memory via a SYSTEM BUS 109.

Next, the configuration of the IF-LBS 106 and the OP-LBS 107 that are the first level cache installed in the CPU 101 is illustrated in FIG. 2.

The cache consists of 2 WAYs WAY0 (201) and a WAY1 (202). When an address signal is given to each of the WAYs, the data of each address are read out and output to the data signal line. Cache RAM output data of the WAY0 are output to a data line 205, and cache RAM output data of the WAY1 are output to a data line 206. In addition, when WAY information is given to a WAY selection circuit 203, either the data line 205 or the data line 206 is selected, and the data are output (207) to the IU 104 (or the EU 105).

Meanwhile, the subject of the present invention is the first level cache that constitutes the instruction cache IF-LBS 106 and the operand cache OP-LBS 107.

In the configuration as described above, the operations of the cache are explained in detail below using a flow diagram.

First, the flow of the cache reading-out operation is illustrated in FIG. 3.

In the reading out from the cache memory, an access is performed to the cache data unit, cache tag unit and TLB unit.

In the cache data unit, bits 14-5 are taken out and sent out from a virtual address (S301), data are taken out within the RAM in the cycle next to the one in which the reference was made (S302), and data of 64 bytes in total are taken out from all cache RAMs in the next cycle (S303). The data taken out consist of data corresponding to two 32-byte WAYs.

In the cache tag unit, bits 14-6 are taken out and sent out from a virtual address (S304), the tag address is taken out within the RAM in the cycle next to the one in which the reference was made (S305), and physical addresses corresponding to 2 WAYs are taken out in the next cycle (S306).

In the TLB unit, bits 63-13 are taken out and sent out from a virtual address, and information representing the access space such as the access-space number or a context ID of the access space and a segment-table starting point is sent out as information representing the access space in which the reference to the cache memory is performed (S307); the virtual address registered in the TLB and the information representing the access space are compared and the physical address corresponding to the registered information that matched is taken out in the cycle next to the one in which the reference was made (S308); and one physical address is read out in the next cycle, and the conversion from the virtual address to the physical address is completed (S309).

In S310, the physical addresses of 2 WAYs read out from the tag unit and the physical addresses read out from the TLB unit are compared, and when they match, it is determined that the fetch target data exists in the cache memory, and the data in the matched cache WAY are used. In S311, information indicating the matched WAY in the cache tag is sent to the cache data unit, and in S312, the data of one of the 2 WAYs read out from the cache data unit are selected, completing the reading out from the cache memory.

After this, in the instruction cache IF-LBS 106, the read out 32-byte data are sent to the instruction unit without change, and the instruction unit side receives it as an instruction corresponding to 8 instructions having 4-byte length. In the operand cache OP-LBS 107, for the read out data, the alignment of the read out data is performed in accordance with the data width (1 byte, 2 bytes, 4 bytes, 8 bytes) of the target of the reading out, and at the same time, sign extension is performed as need perform conversion to a data format in which the positive/negative sign part of the 1 byte-, 2 byte-, 4 byte-data is extended, and the data for which the alignment and sign extension are completed are sent out to a computing unit. The computing unit side writes the received data into a register to be the subject of the reception, and starts the computing using the received data.

In the read out control of a cache memory, at the time when the cache data, cache tag, TLB are read out after two cycles from the access start, presence/absence of a fault is checked by a fault detection circuit disposed respectively. When there is no fault, the process is completed following the process procedure illustrated in FIG. 3. When a fault is detected and if it is a fault in the TLB, the TLB is completely deleted and the registration process of the TLB is performed again, of which detail explanation is omitted here. The conventional processing method in the case in which the cache data or cache tag has a fault is disclosed in Patent document 2. The conventional processing method is described below.

FIG. 4 and FIG. 5 illustrate the flow of the process operation in the case in which the cache data or cache tag has a fault. FIG. 4 illustrates the fault processing in the case in which the data or tag in the operand cache OP-LBS 107 has a fault, and FIG. 5 illustrates the fault processing in the case in which the data or tag in the instruction cache IF-LBS 106 has a fault.

First, in FIG. 4, when a fault is detected in the cache data or cache tag, the operand cache OP-LBS 107 in the SU 103 temporality stops the data processing, and switches an ERROR-STATE flag in a cache control unit to ON (S401). The cache line address and cache WAY having an error are registered in an ERAR (Error Address Register) (S402). There are two types of ERAR: OP-ERAR for the operand cache and IF-ERAR for the instruction cache. Both hold the cache line address bits 14-5 and WAY information. During the ERROR-STATE, all the subsequent processes are suspended, and for the process that has been carried on at that time, for example, a process requesting to bring the cache line to the main memory or to another cache memory, waiting for the arrival of the cache line and the completion of the registration to the cache memory is performed in this case.

After this, a request for performing a fault rescue process is sent to the lower-level cache (SX108) as well as the notification of the occurrence of the fault in the operand cache OP-LBS 107, and, from the information in OP-ERAR, notification of the cache line address and the cache WAY of the cache memory having the fault is performed (S403).

The lower-level cache that received the fault rescue process request has a copy of a notification-source cache tag, and refers to it for the fault rescue process (S404). The copy of the cache tag stores, as information, a Valid bit indicating whether the cache line is valid or invalid, and a physical address corresponding to the cache line. Whether or not the cache line for which the fault processing has been requested is valid is determined (S405), and when the cache line for which the fault processing has been requested is in an invalid state (No), the invalidation due to the fault of the cache line for which the notification has been performed is instructed, and at the same time, whether it is a process for which cache memory (the operand cache or the instruction cache) is clearly presented, and the information of the faulty cache line and the faulty WAY is sent back to the fault notification source without change (S406). In the cache having the fault, upon receiving the instruction for the invalidation due to the fault, a processing flow is performed in the operand cache pipeline for the cache line and the cache way for which the invalidation notification of the operand cache line has been received for rewriting a valid bit of the operand cache tag into an invalid state (S407). In a flow called B cycle (Buffer Read Cycle) in the operand cache pipeline for which the rewriting process is performed, the error processing is completed and the performance of the subsequent instruction is resumed by setting the ERROR-STATE flag to OFF, and at the same time, the notification of the completion of the invalidation of the cache tag is sent to the lower-level cache, as well as the notification of the invalidated cache line and cache WAY (S408). Upon receiving the notification, in the lower-level cache, the corresponding line in the cache tag copy is rewritten into an invalid state (S409).

If the fault-processing target cache line is in a valid state as a result of the search of the cache tag copy (in the case of Yes in S405), an instruction for the discharge of the cache line due to the fault is issued to the cache having the fault, while clearly presenting that it is a process for the operand cache, and the information of the faulty cache line and faulty WAY is sent back to the fault notification source without change (S410). When the cache having the fault receives the instruction for the discharge of the cache line due to the fault, a process flow is performed, for the cache line and cache WAY for which the invalidation notification of the operand cache line has been received, for reading out operand cache data while referring to the operand cache tag, as well as a process flow for reading out operand cache data while rewriting a valid bid in the operand cache tag into an invalid state (S411). In a flow called B cycle in the operand pipeline for which the process for rewriting the cache tag is performed, the error processing is completed and the performance of the subsequent instruction is resumed by setting the ERROR-STATE flag to OFF, and at the same time, the notification of the completion of the invalidation of the cache tag is sent to the lower-level cache, as well as the notification of the invalidated cache line and cache WAY (S414). For the operand cache OP-LBS 107, data transfer may occur at this time. The reading out of the operand cache data is performed twice, with 32 bytes read out with each reading out, so in the flow described above, 64-byte cache data corresponding to one line of the cache memory are read out and stored in a data buffer used in the case of processing involving data transfer, upon processing a request instructed from a lower level called MOB (Move-out buffer). As the reference to the cache tag, a read-out reference and write-in reference are performed. When the cache tag is searched in the read-out reference in S412, S413, whether the cache line is a change type or another is checked. In the case of the change type, the cache line is transferred to the lower level (S415, S416), and in the case of an invalid type or a shared type, the cache line is not transferred to the lower level (S408, S409). As a process procedure without the cache line transfer (S408, S409), the same processing as the fault rescue process at the instruction cache side is performed, completing the invalidation of the cache line. When transferring the cache line (S415, S416), a notification that the fault processing of the cache is to be completed with data transfer is sent, as well as the notification of the cache line and cache WAY that have been the processing target (S415). Upon receiving this notification, in the lower-level cache, the corresponding line in the cache tag copy is rewritten into an invalid state, and the received cache data is written into the data unit of the cache memory of its own cache level (S416).

Meanwhile, FIG. 5 illustrates the fault processing in the case in which the data or tag in the instruction cache IF-LBS 106 has a fault, and in FIG. 5, when a fault is detected in the cache data or cache tag in the IF-LBS 106, the processes in S501-S503 are performed. These processes are similar to the processes S401-S403 in FIG. 4. After that, regardless of the reference result of the cache tag copy, the invalidation due to the fault is instructed with respect to the cache line for which the notification has been performed, while clearly presenting that it is a process for the instruction cache memory, and the information of the faulty cache line and faulty WAY is sent back to the fault-notification source without change (S504). In the cache having the fault, upon receiving the instruction for the invalidation due to the fault, a processing flow is performed in the instruction cache pipeline for the cache line and the cache way for which the invalidation notification of the instruction cache line has been received for rewriting a valid bit of the instruction cache tag into an invalid state (S505). In a flow called B cycle in the instruction cache pipeline for which the rewriting process is performed, the error processing is completed and the performance of the subsequent instruction is resumed by setting the ERROR-STATE flag to OFF, and at the same time, the notification of the completion of the invalidation of the cache tag is sent to the lower-level cache, as well as the notification of the invalidated cache line and cache WAY (S506). Upon receiving the notification, in the lower-level cache, the corresponding line in the cache tag copy is rewritten into an invalid state (S507).

Meanwhile, FIG. 6 is a diagram illustrating the flow of a store operation in a conventional cache.

In the writing-in into a cache memory in response to a store instruction, the reference is performed once to the cache tag unit and the TLB unit and twice to the cache data unit, performing the processing flow twice for the operand cache pipeline.

In the first process flow of the store instruction, an access is performed to the cache data unit, cache tag unit and TLB unit. In the cache data unit, bits 14-5 are taken out and sent out from a virtual address, data are taken out within the RAM in the cycle next to the one in which the reference was made, and data of 64 bytes in total are taken out from all cache RAMs in the next cycle. The data taken out consist of data corresponding to two 32-byte WAYs. In the cache tag unit, bits 14-6 are taken out and sent out from a virtual address, the tag address is taken out within the RAM in the cycle next to the one in which the reference was made, and physical addresses corresponding to 2 WAYs are taken out in the next cycle. In the TLB unit, bits 63-13 are taken out and sent out from a virtual address, and information representing the access space such as the access-space number or a context ID of the access space and a segment-table starting point is sent out as information representing the access space in which the reference to the cache memory is performed, and a reference is made (S601).

The virtual address registered in the TLB and the information representing the access space are compared and taking out of the physical address corresponding to the registered information that matched is performed in the cycle next to the one in which the reference was made, and one physical address is read out in the next cycle, and the conversion from the virtual address to the physical address is completed. The physical address corresponding to the 2 WAYs read out from the tag unit and the physical address read out from the TLB unit are compared, and when they match, it is determined that the store target data exists in the cache memory (S602).

Meanwhile, when a chenge-type bit is read out from the cache tag and it is indicated as the change type, it is determined that the cache memory is not shared and the store can be performed. In addition, the matched cache information is recorded in a store instruction processing unit to be used for a subsequent writing in into the cache memory. At the same time, information indicating the matched WAY in the cache tag is sent to the cache data unit, and data of one of the 2 WAYs read out from the cache data unit are selected. The selected data are stored in a data holding unit or in a partial ECC holding unit other than the store target in an 8-bit data border, in order to rewrite ECC (Error Correction Code) information into an ECC corresponding to the updated data when performing the store with respect to the cache memory (S603). Meanwhile, details of the processing of ECC for non-store-target are described in Patent document 3 and Patent document 4.

Then, after the process in S603, independently from the processing flow at the cache side, the store data that is the store target of the store instruction are received by the operand cache from the computing unit, and stored in a store data register (S604).

Then, while completing the process flow at the cache side, if the transfer of the store data to the cache has been completed, the instruction unit determines whether or not the store instruction can be executed (S605, S606). In other words, whether any branching of an instruction processing line has not occurred for instructions preceding the store instruction and there is no need for shifting to another process such as a trap process is checked. This is realized by confirming the completion of all processing of instructions preceding the store instruction in a commit stack entry in the instruction unit. Then, the instruction unit instructs, with respect to the instruction that has become executable, the execution of the storing by turning a commit signal ON (S607).

At the cache side, in order to write the data of the store instruction for which the commit signal has been received into the cache memory, the second flow of the store process is performed (S608). In the second flow of the store process, an access is made to the cache data unit only. First, in the P cycle (Priority cycle: the request to be processed in the respective requests is determined in accordance with a fixed order of priority), in the cache data unit, bits 14-5 are taken out and sent out from a virtual address, and notification of the store-target WAY and store-target byte position is performed (S609). According to the information, in the cache data unit, the cache RAM to be the store target and the store-target byte position in the RAM are checked, and a WE (Write Enable) signal is turned ON for the target byte position in the target RAM. In parallel with it, the store data stored in the store data register are taken out, and sent out to the cache data unit (S610).

In the next T cycle (TLB/TAG cycle: a cycle to access TAG/LBS/TLB), the store data are stored in the store-target byte position in the store-target cache RAM (S611).

Then, in the R cycle (Result cycle: cycle to complete the pipeline process) after three cycles of the T cycle, an ECC is generated from the store data and data other than the store-target data, and the processing of the store instruction is completed by writing, into an ECC-ARRAY-RAM, the ECC information corresponding to the data after the storing (S612).

While the write operation into the cache in response to a store instruction has been described as above, in the case in which a fault is detected in the first process flow accompanying the store process, the fault is solved by performing the same process as in the case in which a fault is detected in the reading out operation from the cache illustrated in FIG. 3.

Next, with reference to FIG. 7, the operation after the invalidation of a cache line having a fault in a conventional cache to resume the processing of an instruction using the faulty cache line is explained.

When the invalidation of the faulty cache line is completed and the execution of an instruction is resumed, since the cache line used by the resumed instruction has been invalidated, the instruction processing is to be resumed from a cache miss (S701). For the resumed instruction, a cache miss is detected as a result of the search in cache tags (S702); a move-in request is sent out to a lower-level cache to take the cache line with the cache miss into the cache itself; and the physical address in the move-in request, and the cache line address and cache WAY information in the cache memory to register the move-in (MI: Move-In) cache line are held in an MIB (Move In Buffer) (S703). The cache WAY to be the move-in target is subject to, if there is no invalid WAY, the LRU (Least Recently Used), and if there is an invalid WAY, it is selected. Since the cache line is invalidated at the time of the resumption of the instruction execution after an error processing, an invalid cache WAY is selected. At this time, the WAY that was invalidated in the preceding error processing is selected.

In the lower-level cache that received the move-in request, a search is performed in the cache tags in the cache level (S704). When there is a cache hit, cache data taken out from the cache data unit of the cache level is transferred to the request-source cache (S705). In parallel with it, the cache tag copy at the request source is rewritten into the move-in request address, and an instruction for a replace block is sent out to the request-source cache (S706). In the case of the instruction resumption after an error processing, the replace block, that is, the cache WAY that was registered in the cache line being the target of the move-in request before the move-in request has been invalidated, so an instruction that there is no need for the replace process is issued to the request-source cache.

In the move-in request-source cache, upon receiving the cache line, the resumed operation is continued using the received cache line, and the received cache line is written into the cache memory. Since 32 bytes are written in with one writing, for the registration process of one 64-byte cache line, the process flow is performed twice.

First, in the first process flow, the cache line and cache WAY information, and the 32 bytes of the received cache line stored in the MIB are sent to the cache data unit, and written into the RAM of the cache data unit (S707). Next, in the second flow, the remaining 32 bytes are written into the RAM of the cache data unit, and at the same time, the physical address held in the MIB is written into the cache tag unit (S708), and the Valid bit of the cache tag is turned ON (S709). For instructions other than the instruction for which move-in is requested due to the occurrence of a cache miss, data are taken out from the MIB until the registration to the cache memory, and after the registration, an access is performed to the cache tag unit and the cache data unit, to take out the contents of the cache memory. If a fault is detected again at this time, the series of processing flows of the fault processing are performed again, to solve the fault.

If the fault is not solved after repeating the fault-solving process flow for a predetermined time, the faulty cache line is cut off by a means called block delete. Details of the block delete process are described in Patent document 5. However, when the block delete process is carried out, performance decline due to the separation of one cache line is inevitable. Therefore, a method to rescue a one-bit permanent fault of a cache memory without losing a cache line has been sought for.

A conventional cache without a cache line alternation register has been explained as above with reference to FIG. 1-FIG. 7.

To summarize the description above, in the implementation system of a conventional cache line alternation register, the physical address is used for the comparison of the alternation-target addresses, and when they match, data in the alternation register are read out, but there has been a problem that since the physical address has a large number of comparison-target bits, the address processing takes time. In addition, in order to obtain the physical address to be the comparison target, a reference needs to be made to the TLB and cache tag, so the cache line alternation register can be used for the reading out from the cache, but in the writing into the cache, since the flow of the reference comparison of the TLB and cache tag and writing-in significantly deviates from the normal cache control flow, the use of the cache line alternation register needed to be abandoned, and every time the cache line alternation register becomes the store target, for example, the cache line alternation register was invalidated and the operation was restarted from the reference to the main memory, causing some performance decline with the store operation.

Meanwhile, conventionally, the alternation register has been configured to be able to switch all the bits in one cache line. However, in practice, the chances that a one-bit error occurs at a plurality of places in one cache line are low, and the realization of the function of the alternation register with a smaller number of registers has been sought for, to save circuit resources.

Therefore, a new cache line alternation register is installed in a conventional cache, to solve the problem.

Patent document 1: Japanese Laid-open Patent Application No. 52-15236
Patent document 2: Japanese Patent No. 3483296
Patent document 3: Japanese Patent Application No. 2006-999902 (WO 2007/094045)
Patent document 4: Japanese Patent Application No. 2006-353505 (Japanese Laid-open Patent Application No. 2008-165449)
Patent document 5: Japanese Patent Application No. 2006-999821 (WO 2007/097026 A1)

SUMMARY

In the present invention, a cache memory apparatus is configured to include a data holding unit having a plurality of ways that has a plurality of cache lines and holding data in the cache lines; an alternation data register holding data in one line of the cache lines or in a part of the cache lines held by the data holding unit; an alternation address register holding an index address that is used for cache access and indicates a faulty cache line in which a fault has occurred and a part in which the fault has occurred in the faulty cache line in the data holding unit; an alternation way register holding information of a way in the data holding unit including a faulty bit in the data holding unit; an address match circuit comparing, when an access is performed to the data holding unit, an index address used for the access and the index address held by the alternation address register; and a way match circuit comparing, when an access is performed to the data holding unit, way information used for the access and way information held by the alternation way register.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 1 is a diagram illustrating the entire configuration of a conventional CPU.

FIGS. 14A-14B are a flow diagram describing the operation of resuming the processing of an instruction using a faulty cache line after a cache line is invalidated in a cache of the present embodiment.

FIGS. 16A-16D are a diagram describing the case in which the number of bits of the alternation address register is increased by one-bit in the present embodiment.

FIG. 17 is a diagram illustrating the quantitative relationship between the alternation address register and an alternation data register in the present embodiment.

DESCRIPTION OF EMBODIMENTS

Hereinafter, an example of the embodiment of a cache line alternation register is described with reference to the drawings.

Figure 8:
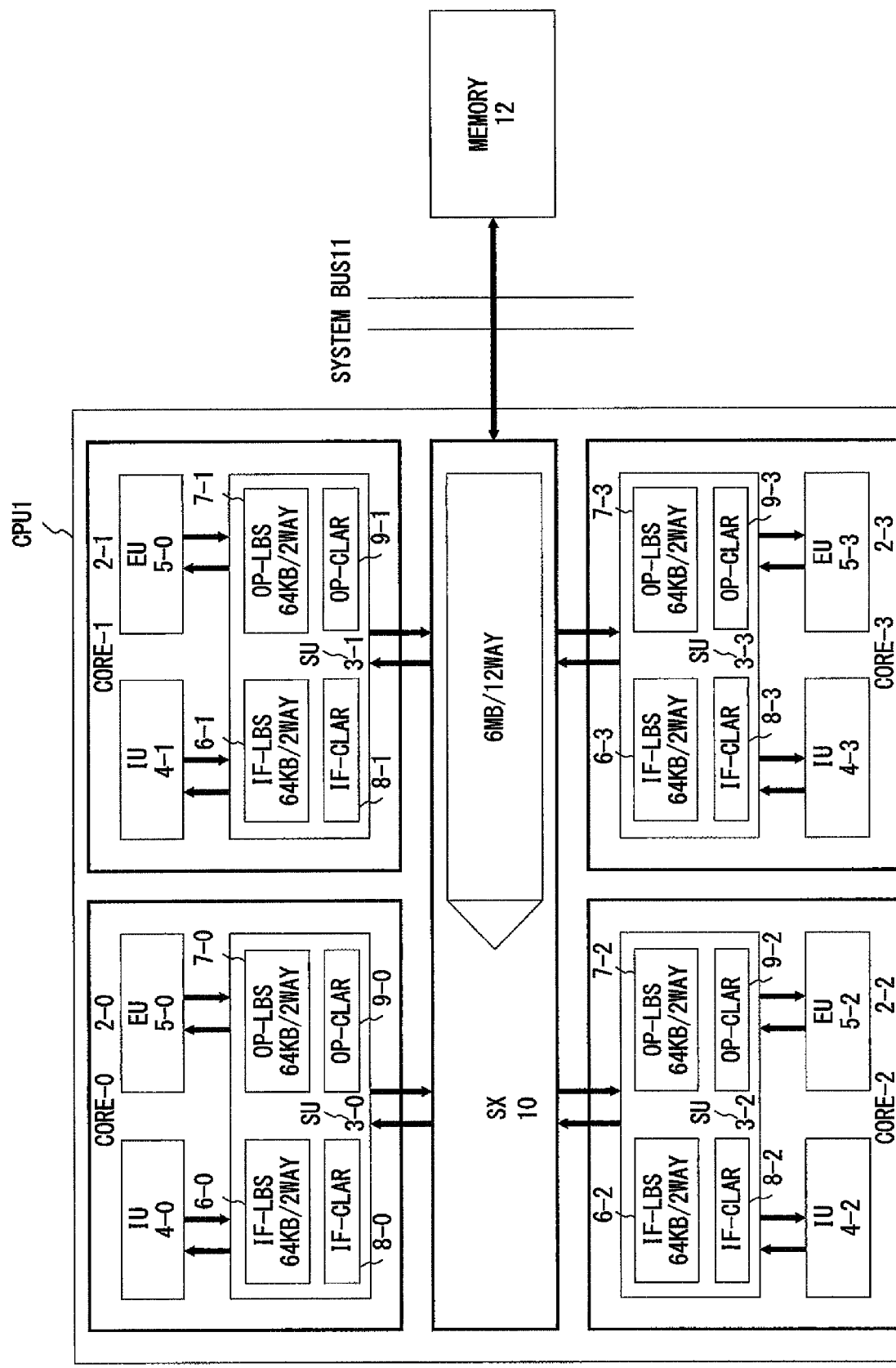
FIG. 8 is a diagram illustrating the entire configuration of a CPU of the present embodiment.

The entire configuration of the CPU being the present embodiment is illustrated in FIG. 8.

The configuration of a CPU 1 in FIG. 8 is almost the same as the configuration of the CPU 101 illustrated in FIG. 1. A CORE 2 corresponds to the CORE 102 in FIG. 1, and an SU 3 corresponds to the SU 103 in FIG. 1, an IU 4 corresponds to the IU 104 in FIG. 1, an EU 5 corresponds to the EU 105 in FIG. 1, an IF-LBS 6 corresponds to the IF-LBS 106 in FIG. 1, an OP-LBS 7 corresponds to the OP-LBS 107 in FIG. 1, an SX 10 corresponds to the SX 108 in FIG. 1, and a SYSTEM BUS 11, Memory 12 correspond to the SYSTEM BUS 109, Memory 110 in FIG. 1, respectively.

In the present embodiment, IF-CLAR (cache Line Alternation Register) 8, OP-CLAR 9 are newly added.

Figure 2:
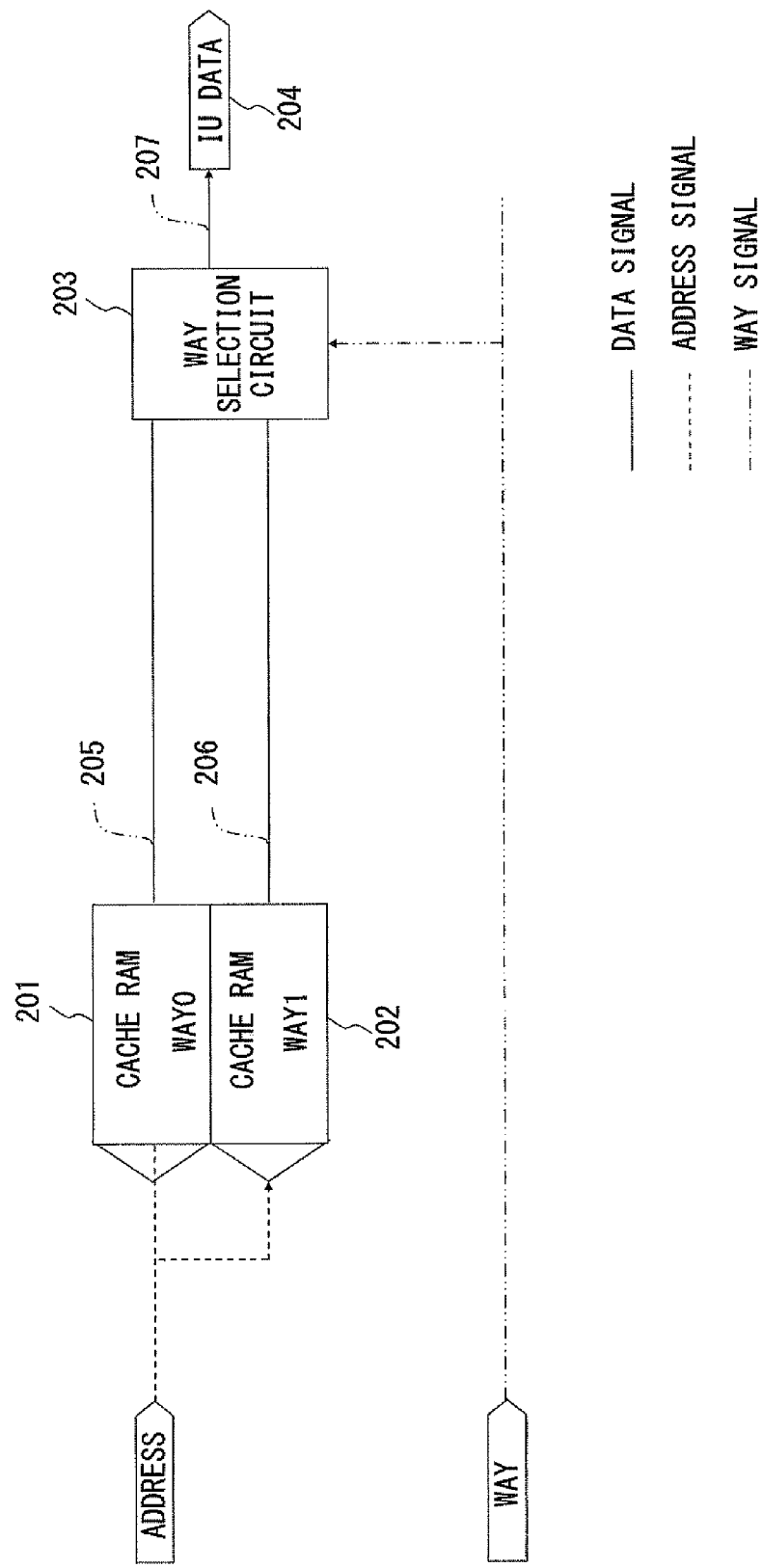
FIG. 2 is a diagram illustrating the configuration of a conventional cache.
Figure 9:
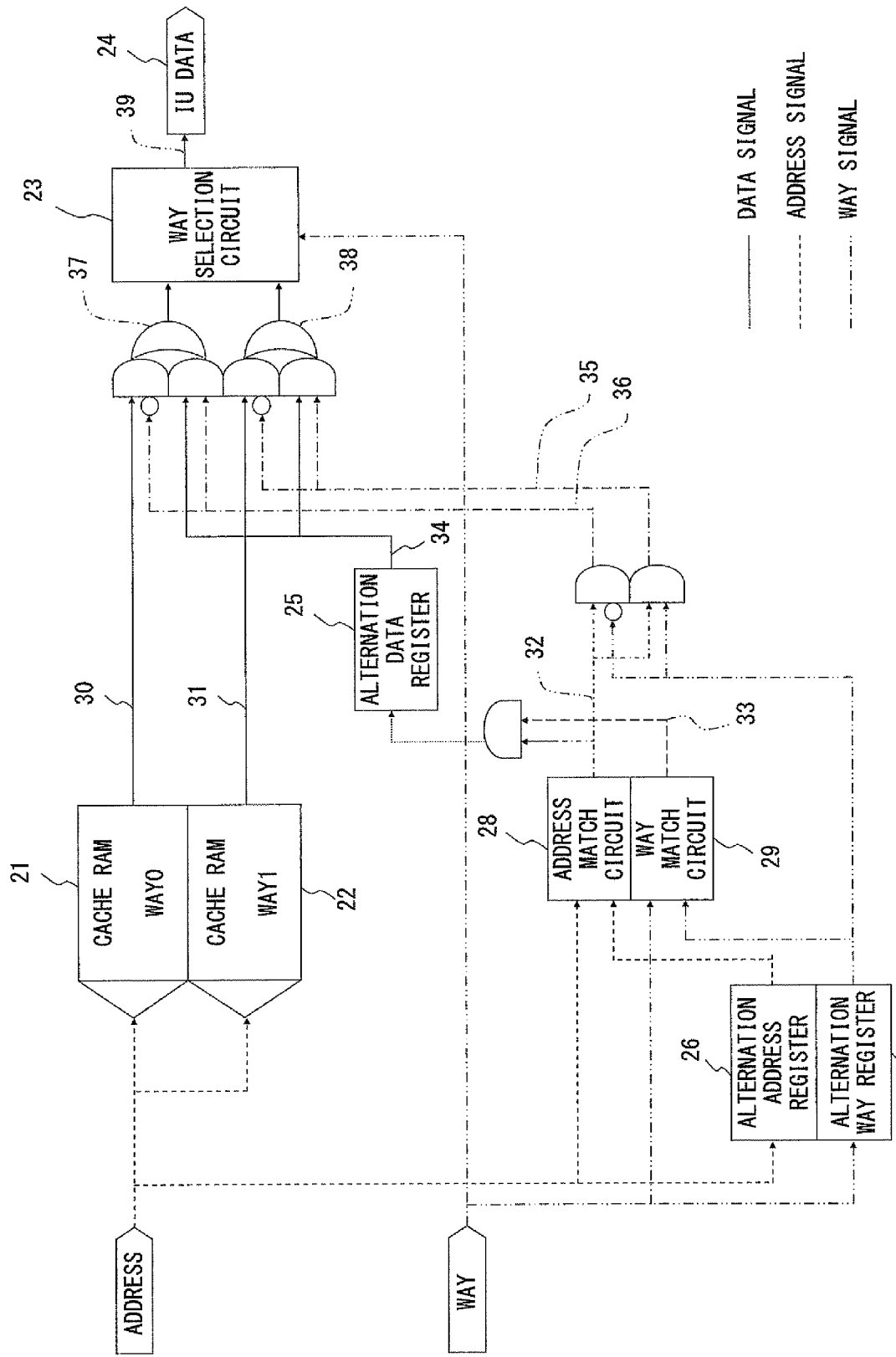
FIG. 9 is a diagram illustrating the configuration of a cache of the present embodiment.

The configuration of the cache line alternation register CLAR of the present embodiment is illustrated in FIG. 9, in which the parts added in the present embodiment are apparent in comparison with FIG. 2.

The cache line in cache RAMs 21, 22 is controlled in units of 64 bytes, and the 64 Kbytes in the cache RAM are configured in 2 WAYs. The number of cache lines per one WAY is 512, and the access address to the cache line is composed of 9 bits. As the cache data RAM, 8 RAMs with their read-out data width being 8 bytes and their number of lines being 1024 are adopted.

The cache line alternation register of the present embodiment is composed of three kinds of registers and two kinds of match circuits. The first register is an alternation address register (CLAAR: Cache Line Alternation Address Register) 26 that registers and holds an index address indicating where in the cache memory the one-bit permanent error cache line and the error-bit position exist. The second register is an alternation WAY register 27 that registers and holds the WAY information of the one-bit permanent error cache line. The third register is an alternation data register (CLADR: Cache Line Alternation Data Register) 25 that registers and holds data corresponding to a half line of the RAM permanent error cache line. Meanwhile, the first match circuit is an address match circuit 28 that compares index addresses. The second match circuit is a WAY match circuit 29 that compares WAYs.

To a data signal line 30, output data of a WAY 0(21) is output; to a data signal line 31, output data of a WAY 1 (22) is output; to a signal line 32, a CLAAR-MCH signal being the result of the comparison in the address match circuit 28 is output; to a signal line 33, a WAY-MCH signal being the result of the comparison in the WAY match circuit 29 is output; to a data line 34, output data of the alternation data register 25 is output; to a signal line 35, a WAY0CLAAR-MCH signal is output; and to a signal line 36, a WAY1CLAAR-MCH signal is output. 37 is a selection circuit of the cache RAM (21) at the WAY 0 side and the alternation data register 25, and 38 is a selection circuit of the cache RAM (22) at the WAY 1 side and the alternation data register 25. To a data line 39, data to be transmitted to the instruction unit or the execution unit are output.

Figure 10:
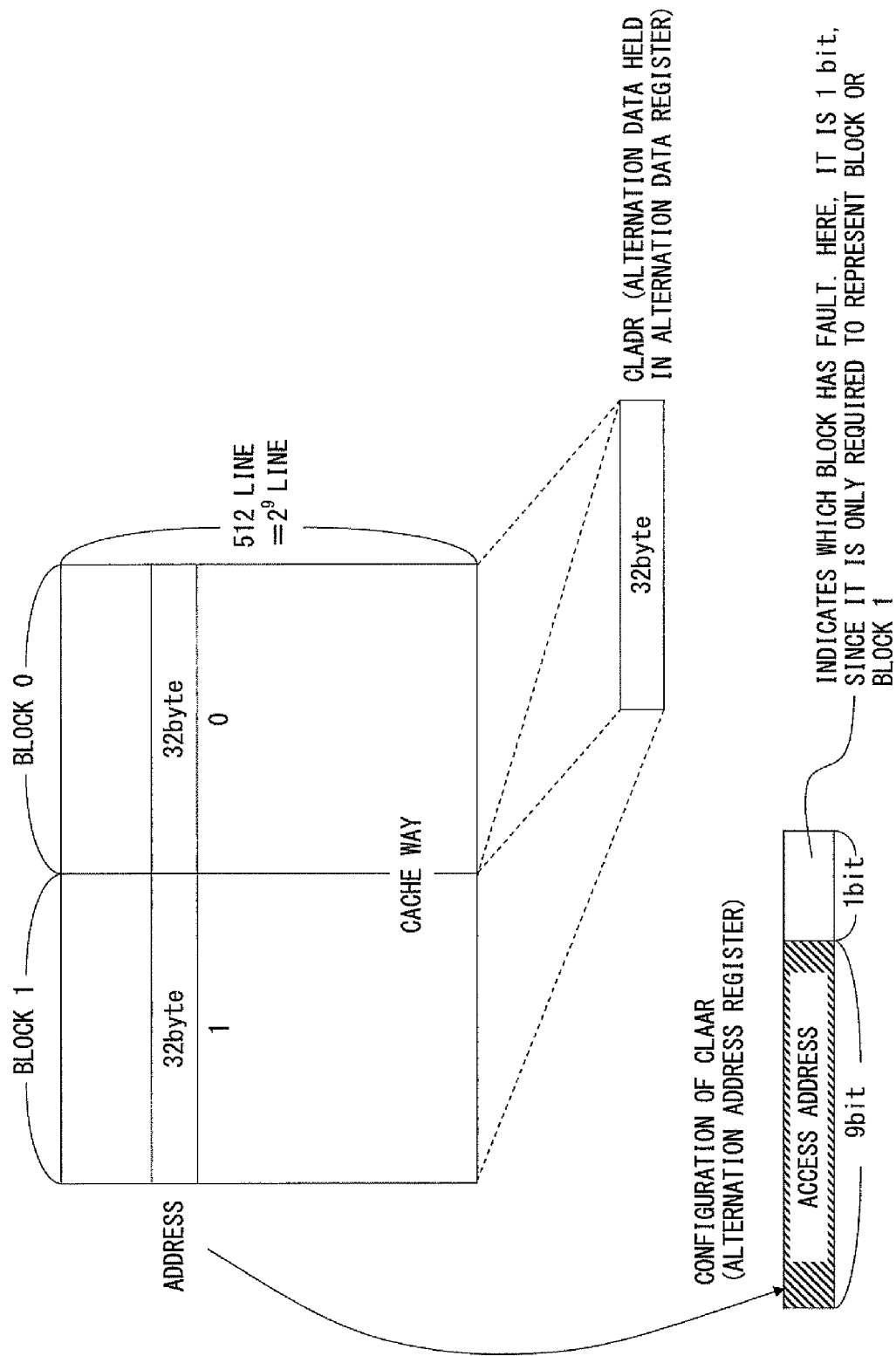
FIG. 10 is a diagram describing the configuration of an alternation address register of the present embodiment.

The description of the alternation address register 26 is presented in FIG. 10. In the present embodiment, the cache memory is divided into two blocks consisting of a block 0 and a block 1, in order to indicate where in the cache memory the error-bit position at which a fault has occurred exists. In other words, the index address consists of 9 bits for the cache line address (access address) and one-bit for indicating the faulty block: 10 bits in total. For this reason, the alternation address register 26 holds the 9 bits (bits 14-6 taken out from a virtual address) for the access address indicating the cache line in which the fault has occurred, and one-bit (bit 5 taken out from a virtual address) indicating in which block a fault has occurred. Then, the alternation data register 25 is only required to be able to hold data of 32 bytes that is the size of each block.

The cache operation in the configuration illustrated in FIG. 9, FIG. 10 is described in detail below using flow diagrams.

Figure 3:
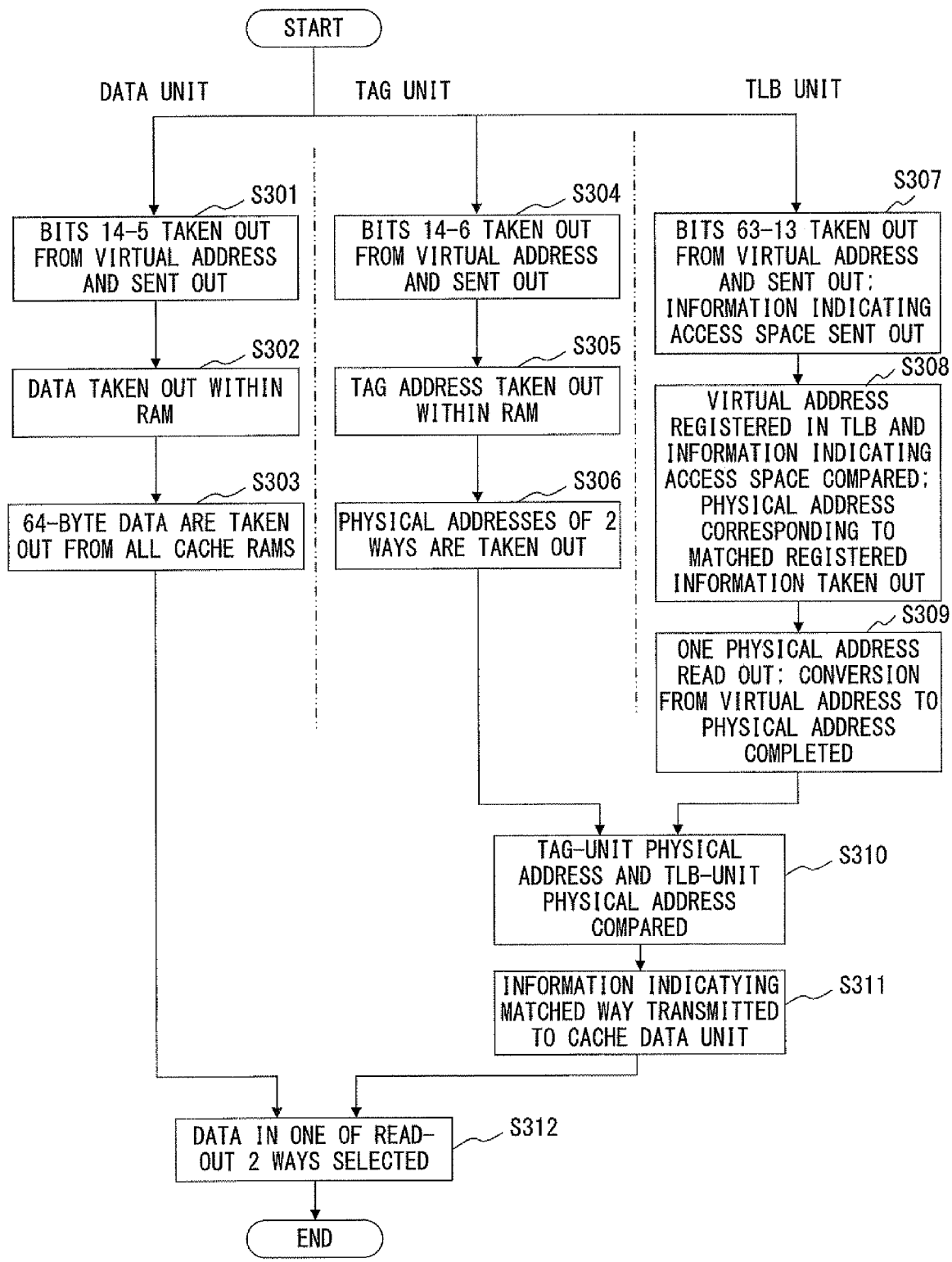
FIG. 3 is a flow diagram describing a conventional cache reading-out operation.
Figure 11A:
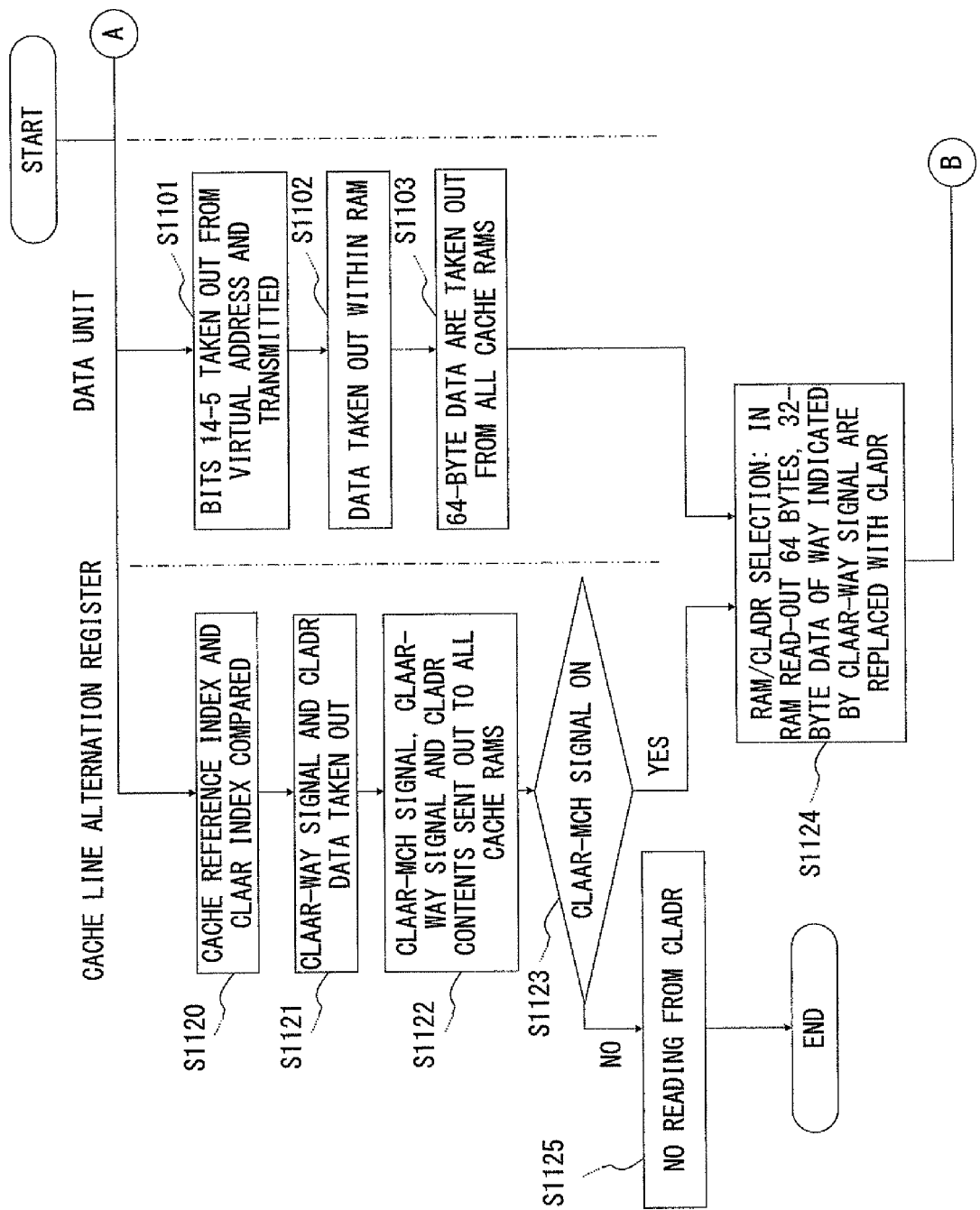
FIGS. 11A-11B are a flow diagram describing a cache reading-out in the present embodiment.
Figure 11B:
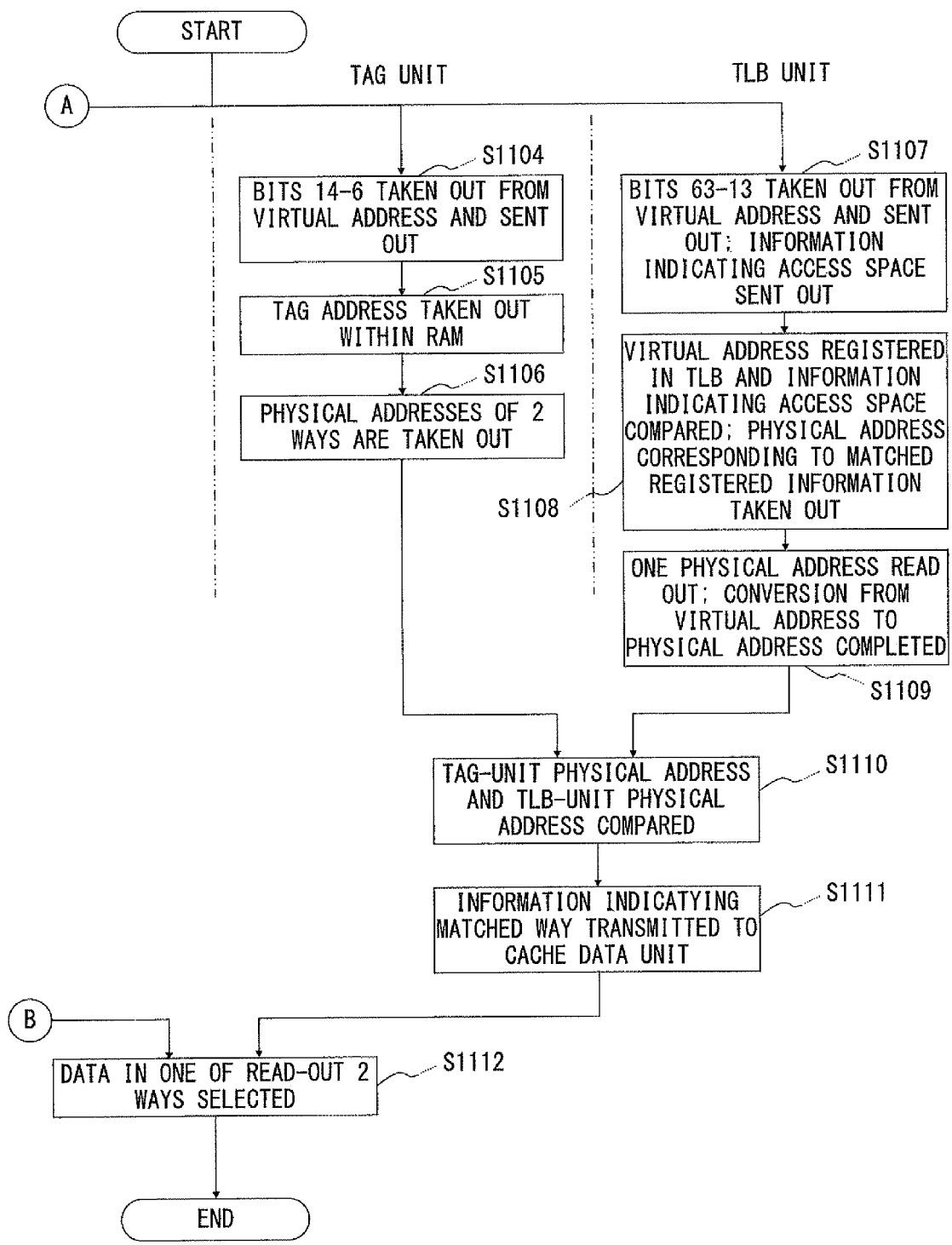

First, a flow diagram explaining the cache reading-out operation in the present embodiment is described in FIG. 11. In the reading-out from a cache, a reference is made to the cache data unit, cache tag unit and TLB unit as in a conventional manner, and at the same time, an access is made to the alternation address register. In the processes in S1101-S1112 in FIG. 11, the same processes as in S301-S312 in FIG. 3 illustrating the conventional cache reading-out operation are to be performed.

In the present embodiment, the processes illustrated in S1120-S1125 are performed in the cache line alternation register.

First, in the cycle to make a reference to the cache data unit, the index address stored in the alternation address register 26 and the index address and cache WAY of the cache used for the reference to the cache data unit are compared with the contents held in the alternation address register 26 and the contents held in the alternation WAY register 27, respectively (S1120). Then, a CLAAR-WAY signal and CLADR data are taken out (S1121). A CLAAR-MCH signal indicating the comparison result, a CLAAR-WAY signal indicating the alternation-target WAY stored in the alternation WAY register 27 and the contents of the alternation data register 25 are sent out to all the cache data RAMs (S1122). In the next cycle, if the CLAAR-MCH signal and the WAY-MCH signal are ON in S1123, in the 64-byte data read out from all the cache RAMs, the 32-byte data of the WAY indicated by the CLARR-WAY signal are replaced with the contents of the alternation data register 25, to be the cache read-out data (S1124). If the CLAAR-MCH signal is OFF in S1123, no operation is performed for the 64-byte data read out from all the cache RAMs (S1125), and the data read out from the cache memory are used without change.

After this, the same operation as in a conventional cache apparatus is performed, that is, data of one of the cache WAYs are selected from the tag match result, and the reading-out from the cache memory is completed. Thus, the function of the cache line alternation register is made to be valid even when there is no occurrence of a fault.

Figure 4A:
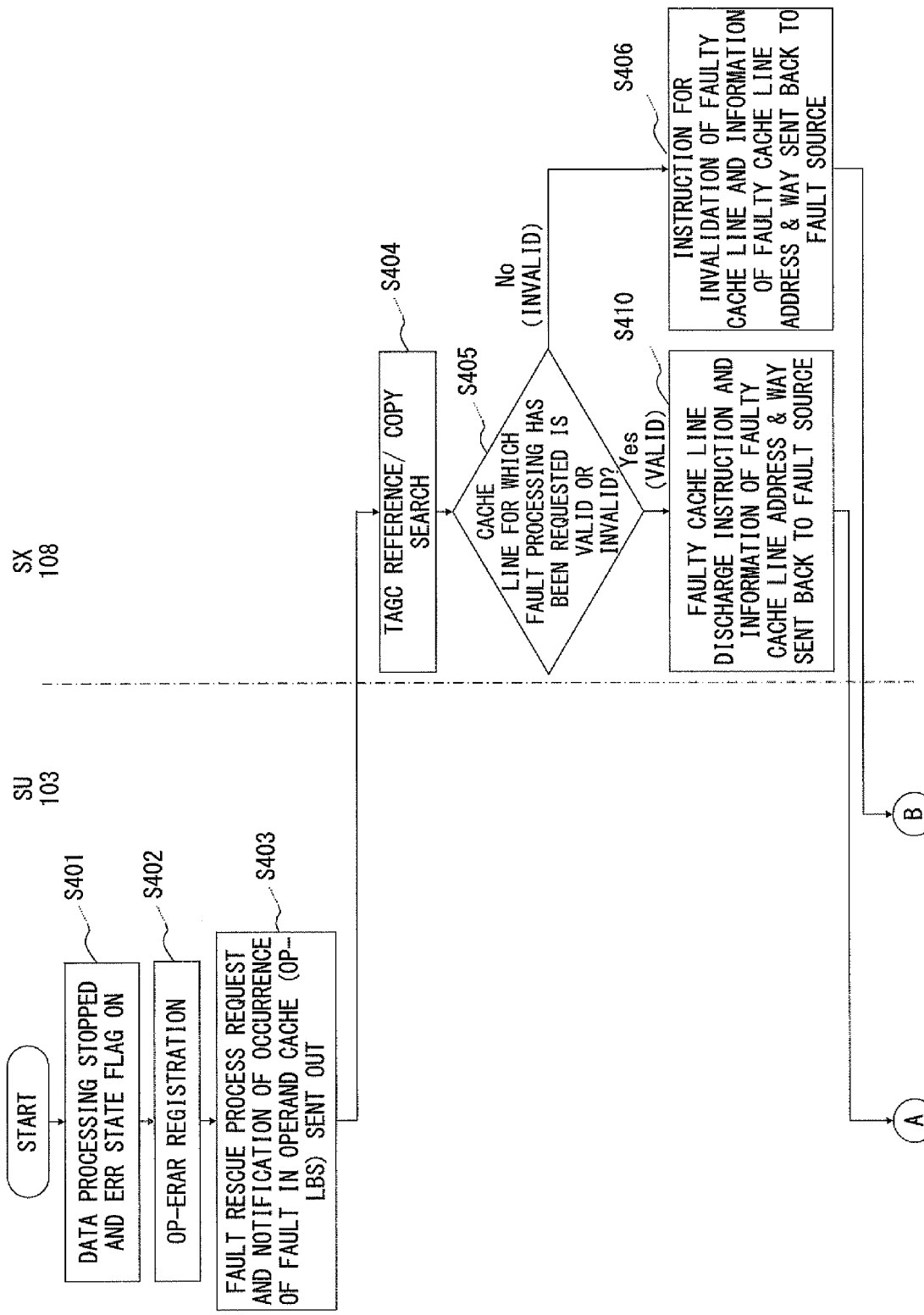
FIGS. 4A-4B are a flow diagram describing the fault processing in the case in which a conventional OP-LBS has a fault.
Figure 4B:
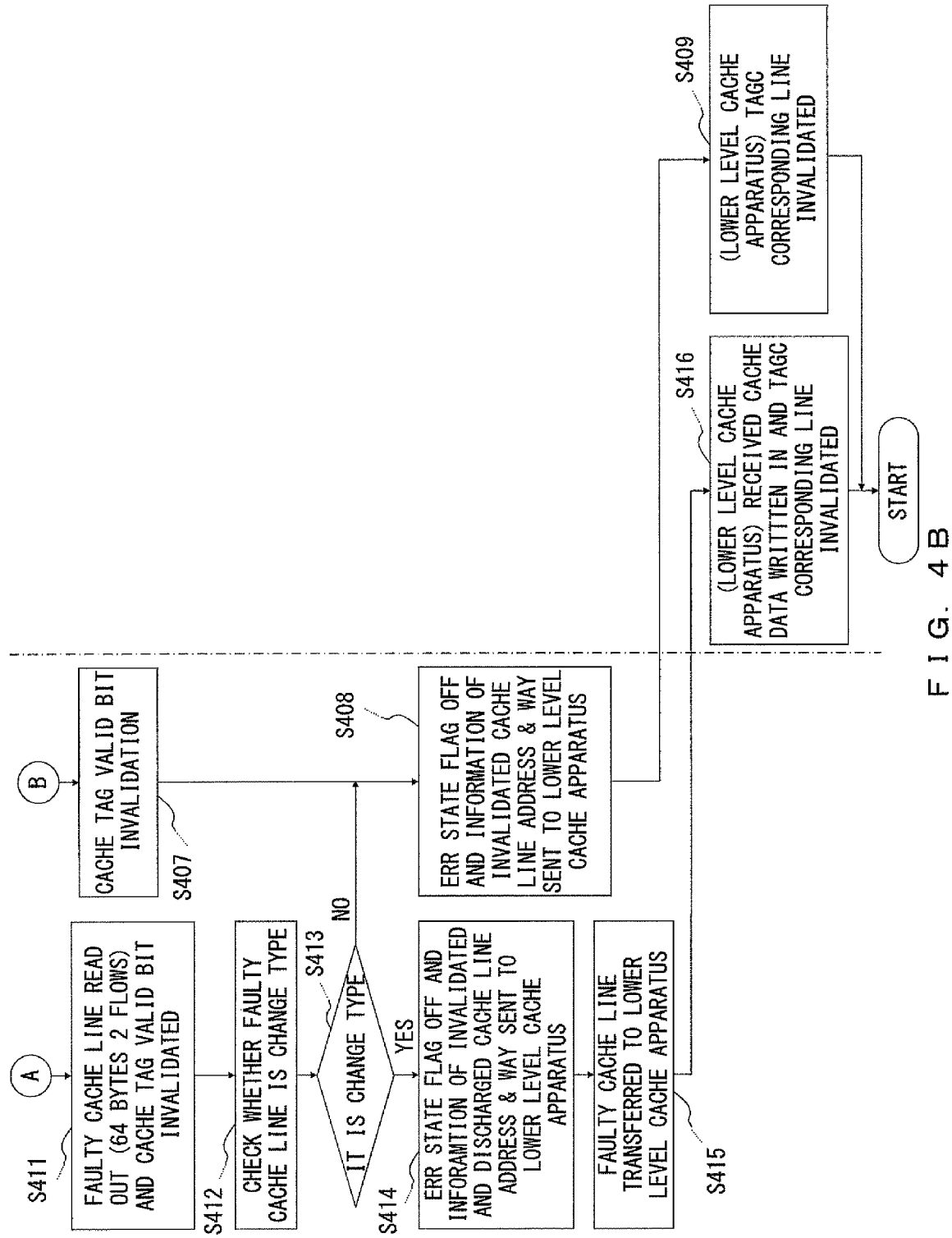
Figure 5:
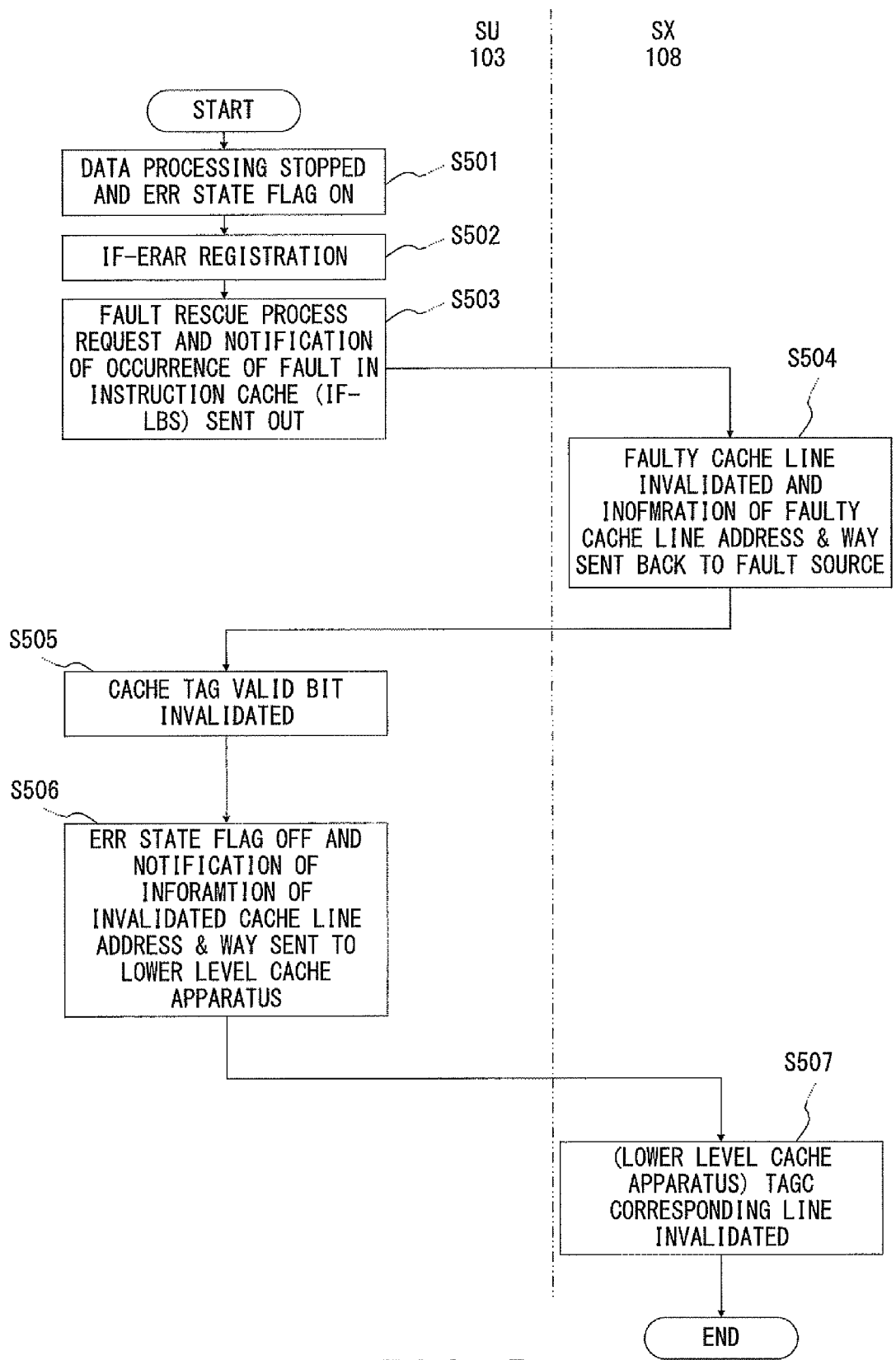
FIG. 5 is a flow diagram describing the fault processing in the case in which a conventional IF-LBS has a fault.
Figure 12A:
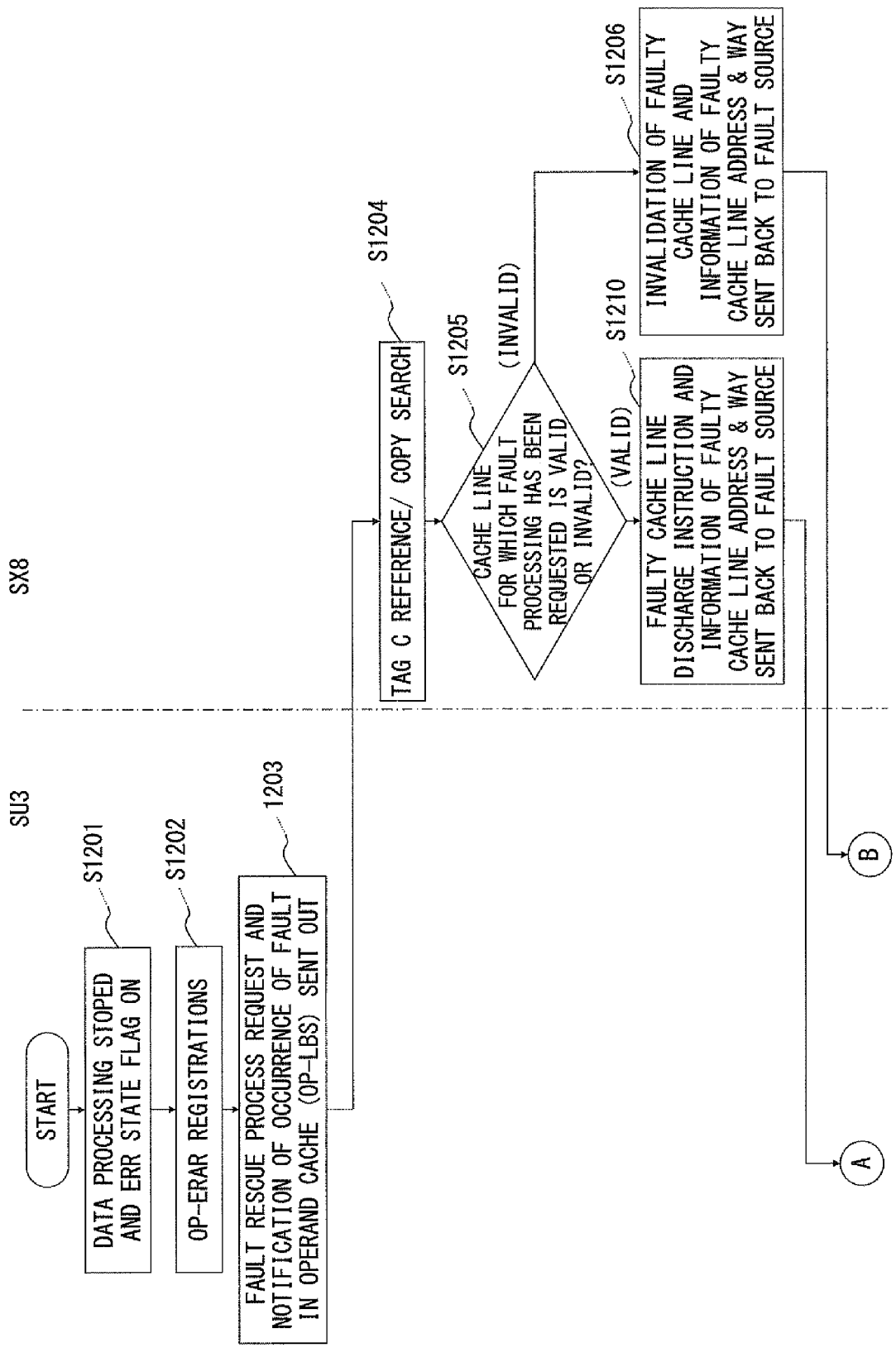
FIGS. 12A-12B are a flow diagram describing the fault processing in the case in which an OP-LBS of the present embodiment has a fault.
Figure 12B:
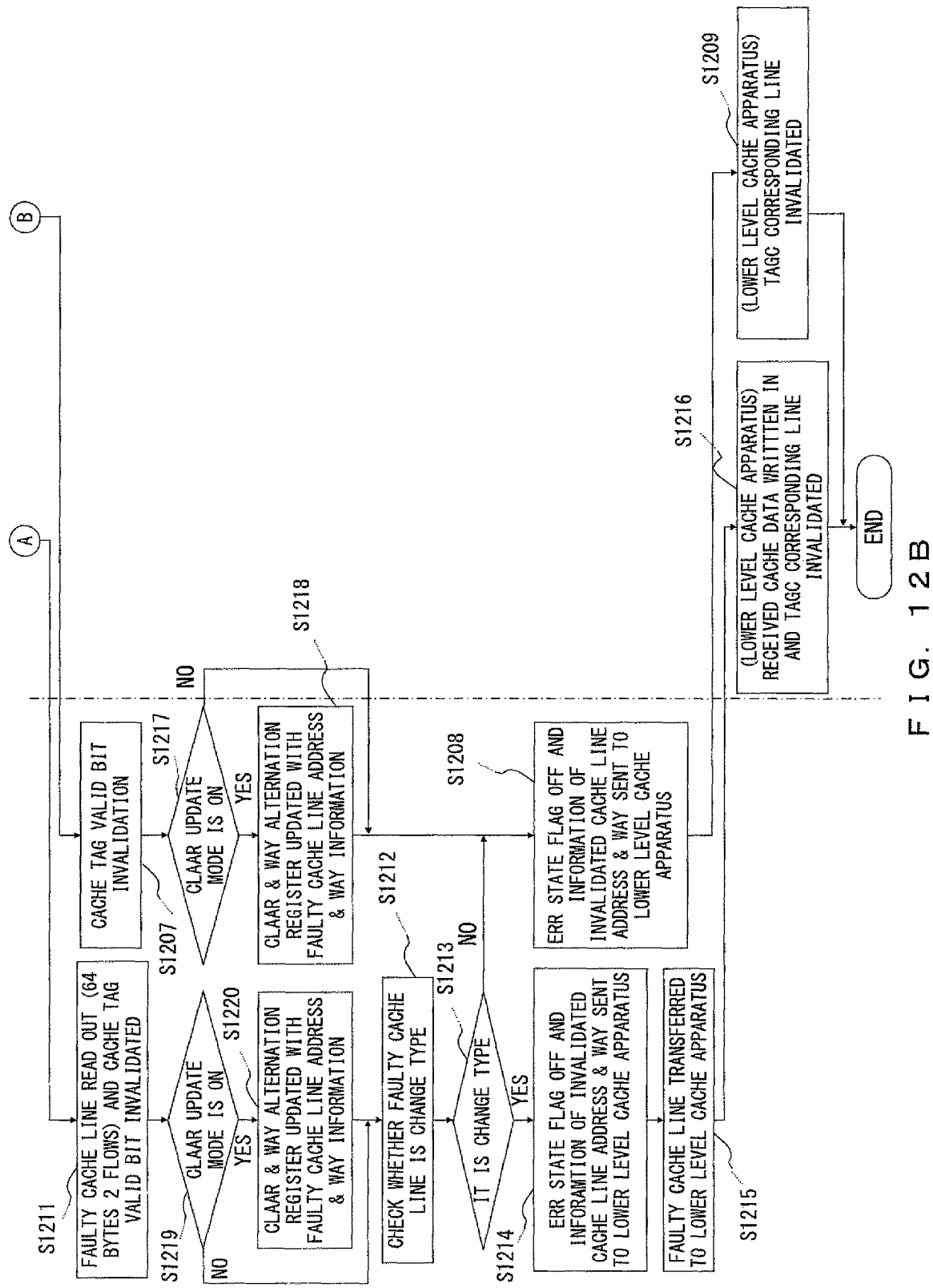
Figure 13:
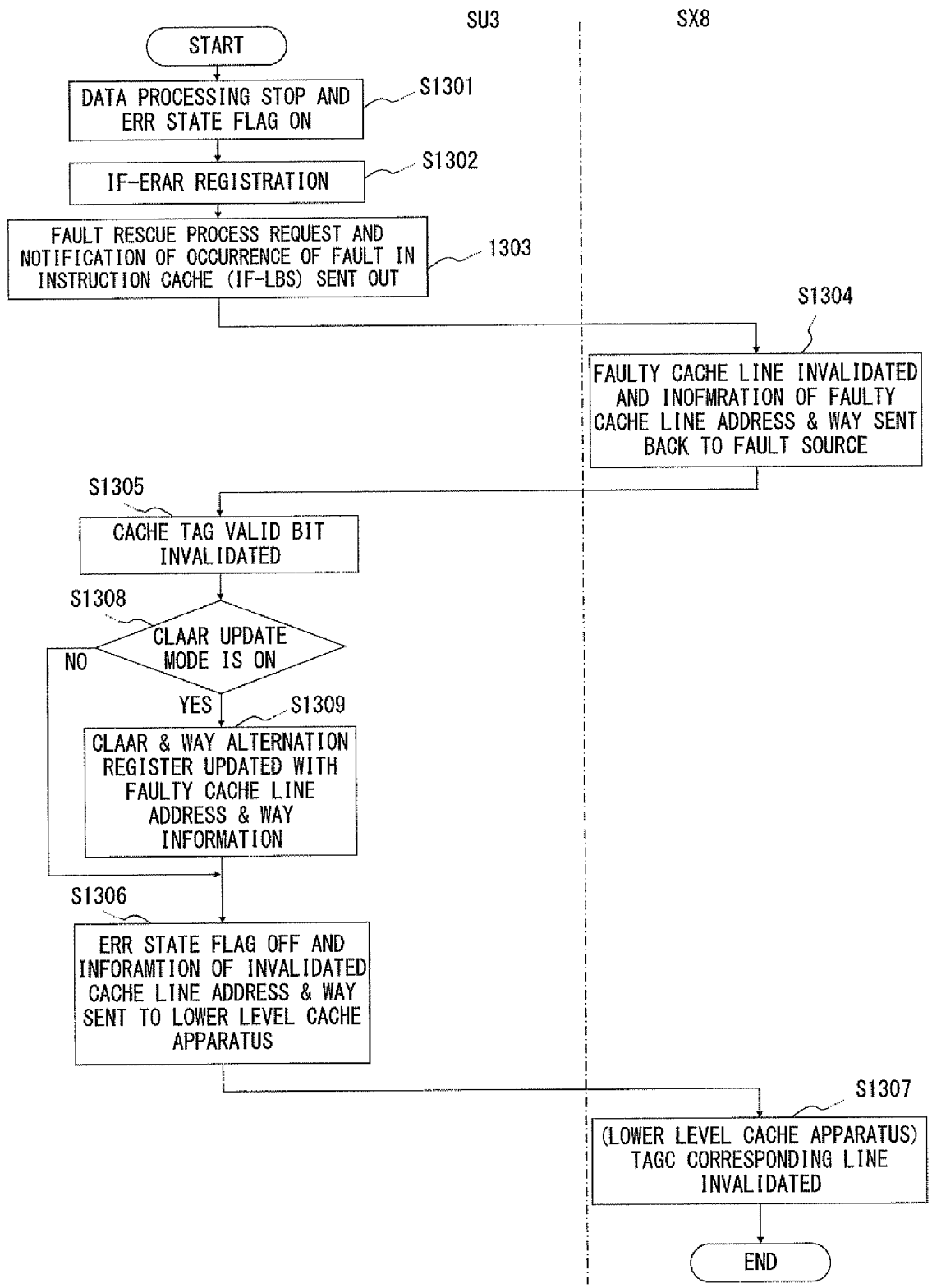
FIG. 13 is a flow diagram describing the fault processing in the case in which an IF-LBS of the present embodiment has a fault.

Next, flow diagrams describing the fault processing in the case in which the OP-LBS and the IF-LBS of the present embodiment has a fault are presented in FIG. 12, FIG. 13 respectively. While in the fault processing in the case in which there is a fault, processes similar to conventional processes are performed, the processes of S1217, S1218, S1219, S1220 are added in FIG. 12, the processes of S1308, S1309 are added in FIG. 13, and the other processes are the same. The processes from S1201 to S1216 in FIG. 12 correspond to the processes from S401 to S416 in FIG. 4, and the processes from S1301 to S1307 in FIG. 13 correspond to the processes from S501 to S507 in FIG. 5.

Now, when a fault is detected in the cache data RAM, that is, when a fault in the cache data unit is detected without the CLAAR-MCH signal being turned ON, it indicates that a fault is performed in the data read out from the cache data RAM. At this time, in order to invalidate the faulty cache line in the conventional fault processing flow, at the timing after two cycles of the R cycle in the pipeline process to rewrite the valid bit of the cache tag into an invalid state, the invalidation-target cache index and cache WAY are written into the alternation address register 26 and the alternation WAY register 27 (S1218, S1220, S1309).

By the operation described above, the faulty cache line and its WAY is registered in the cache line alternation register, so when a reference is made to the faulty cache line, the contents of the cache line alternation register are to be referred to and the contents of the faulty cache RAM are not to be used, making it possible to conceal the fault of the cache RAM and to make an attempt for the recovery from the fault.

Meanwhile, explanation about modes in S1217, S1219, S1308 is to be presented later.

Figure 7:
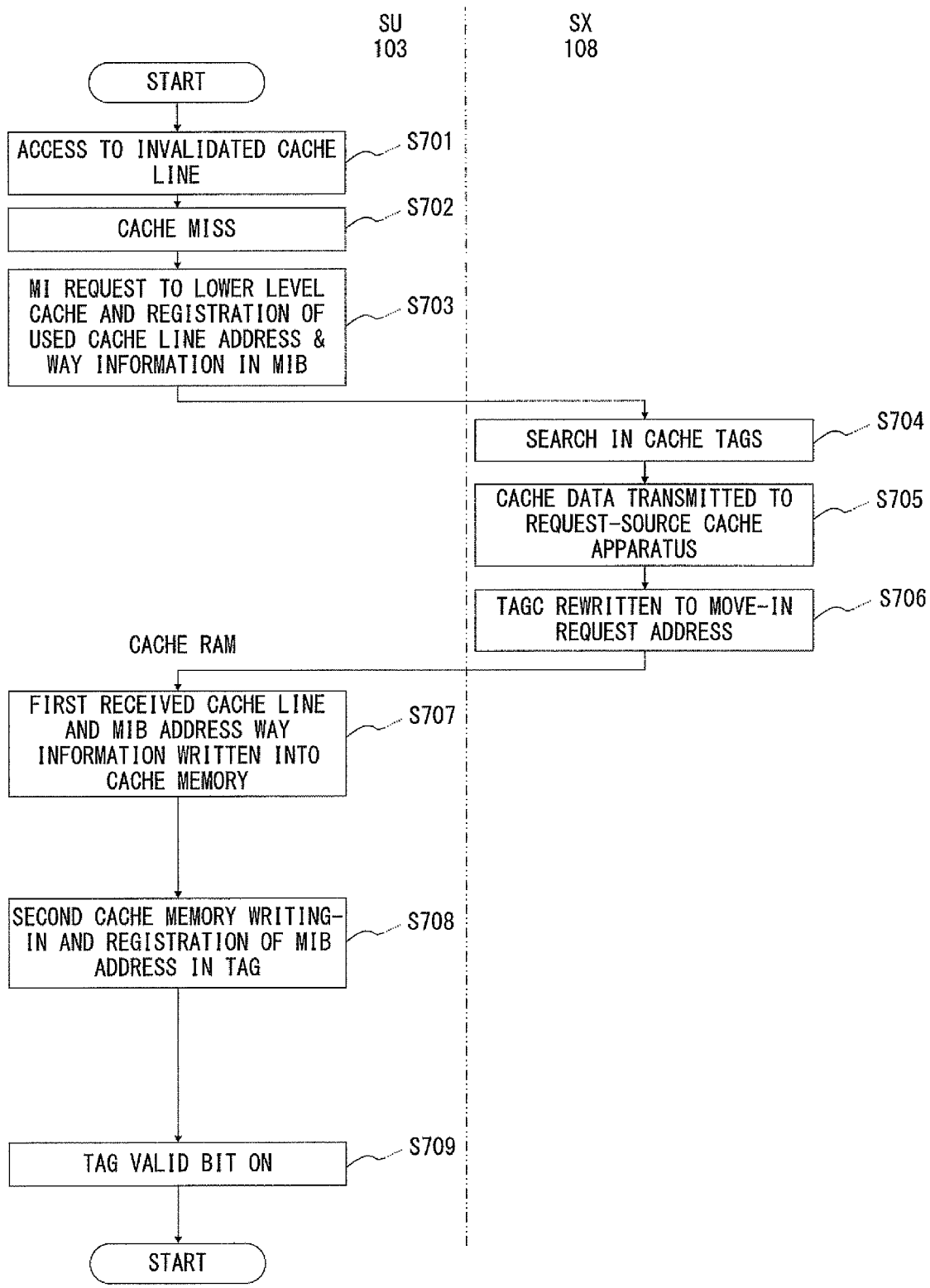
FIG. 7 is a flow diagram describing the operation of resuming the processing of an instruction using a faulty cache line after a cache line is invalidated in a conventional cache.
Figure 14B:
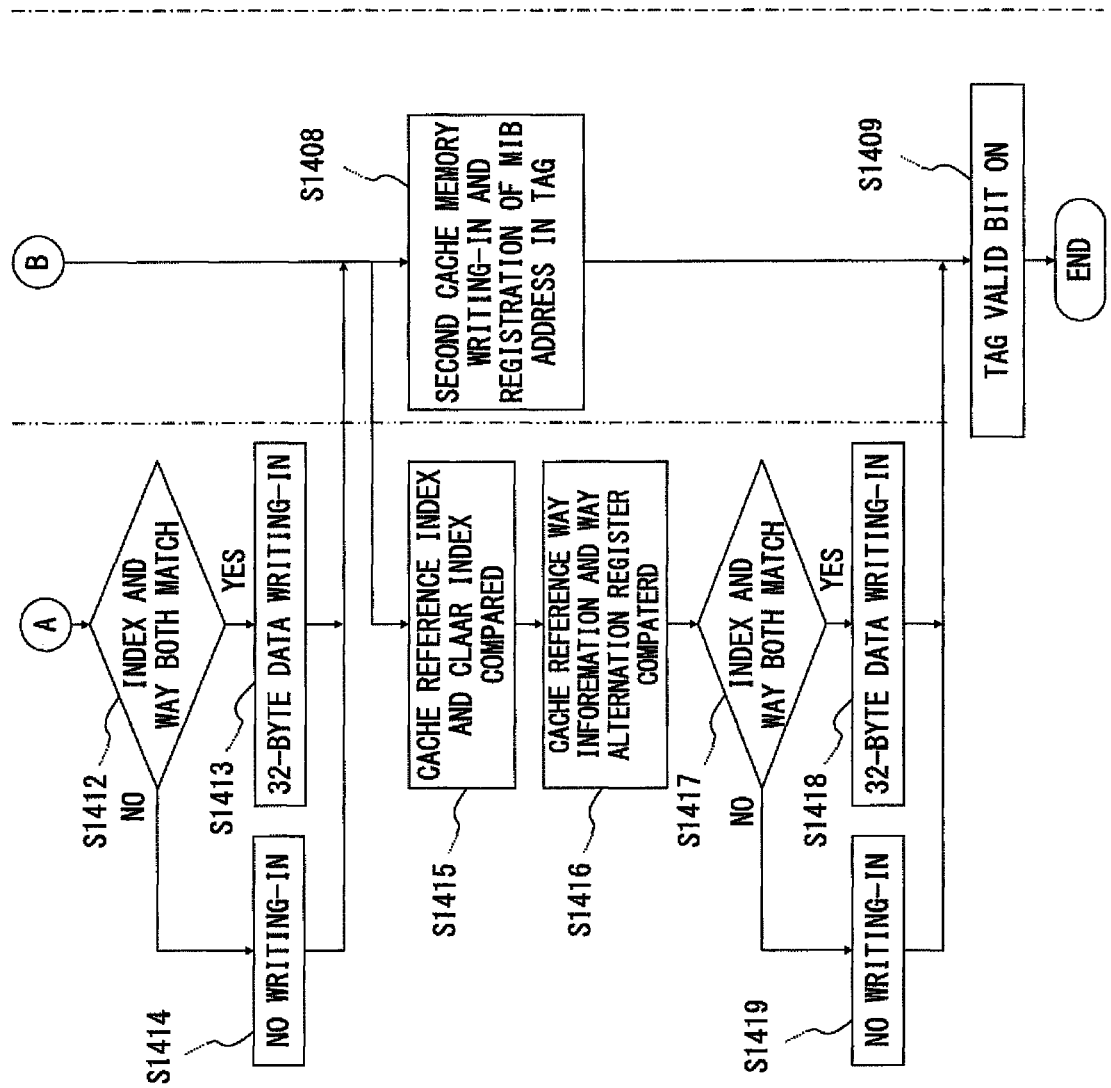

Next, the operation to resume the processing of an instruction using the faulty cache line after the invalidation of the cache line is illustrated in FIG. 14. Processes similar to the conventional processes are to be performed for the operation to resume the faulty cache line after the invalidation of the cache line as well. In other words, the processes in S1401-S1409 in FIG. 14 correspond to S701-S709 in FIG. 7. Then, the processes described in S1410-1419 in FIG. 14 performed in the cache line alternation register are added.

When the execution of the instruction is resumed after the completion of the invalidation of the faulty cache line and the registration of the faulty cache index in the alternation address register 26, the cache line used by the resumed instruction is registered in the alternation address register 26. Since this cache line is still in the state having the cache miss, the move-in of the cache line is requested as in a conventional manner. After that, when a cache line arrives, an instruction of the cache index and cache WAY is sent to the cache data unit, while the moved-in cache line is sent out to the cache data unit, instructing the register of the cache line.

In the cache data unit, in the cycle next to the one in which the instruction for the cache line registration is received, the move-in data is written into the cache data RAM corresponding to the received cache index and cache WAY, while the writing-in target cache index and cache WAY are compared with the contents held by the alternation address register 26 and the contents held by the alternation WAY register 27, respectively (S1410, S1411). When both the cache index addresses and cache WAYs match in S1412, the move-in data is also written into the alternation data register 25 (S1413). In the case of no match in S1412, nothing is written in (S1414) By doing so, even if data written into the cache are faulty, the data can be ready in the alternation data register 25. For this reason, when a reference such as the reading-out from the faulty cache line is performed, data stored in the cache line alternation register is to be referred to, making it possible to take out data in a state in which the data are not faulty.

Meanwhile, the processes in S1415-S1419 are the same as the processes in S1410-S1414.

Figure 6:
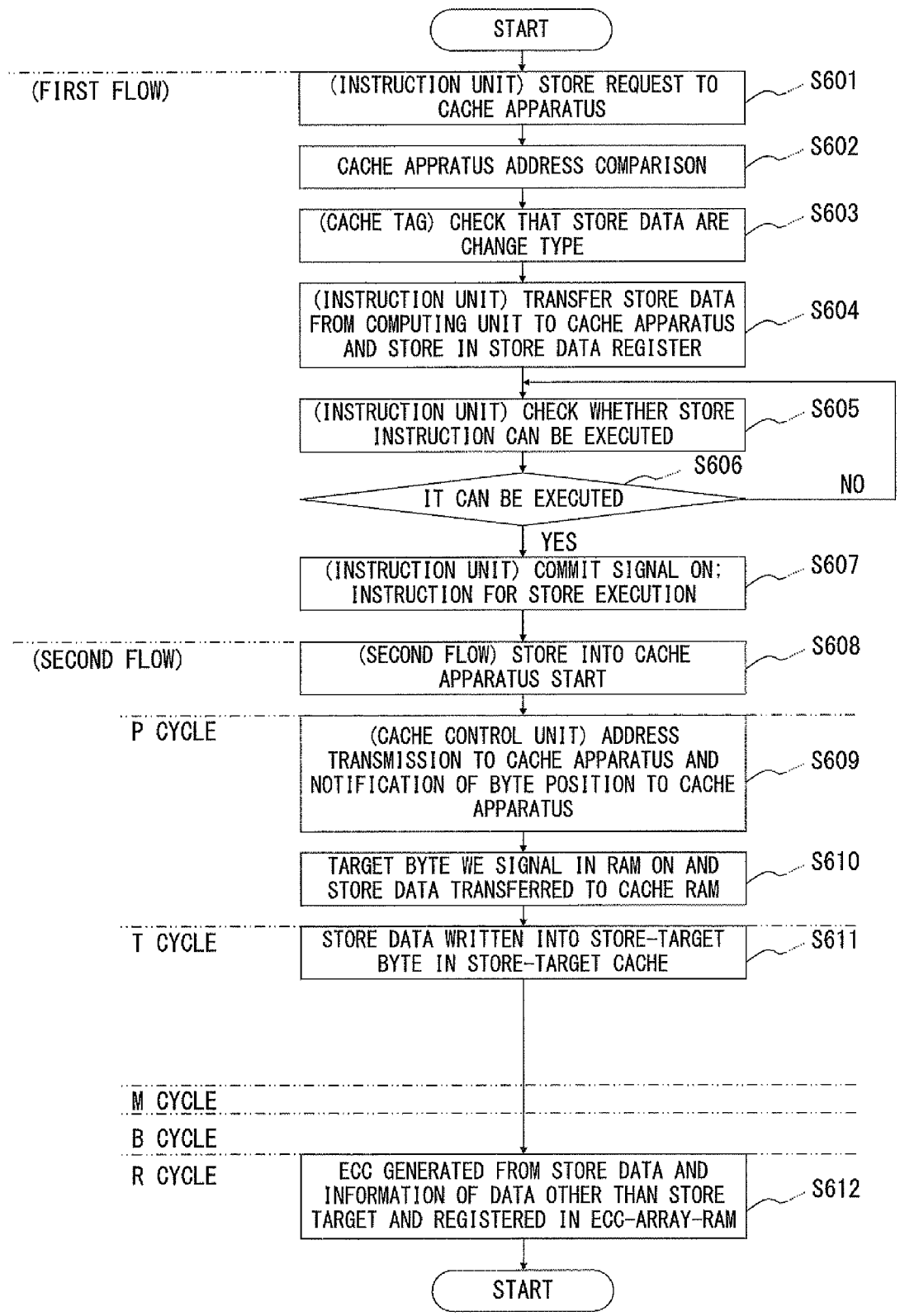
FIG. 6 is a flow diagram describing the store operation of a conventional cache.
Figure 15A:
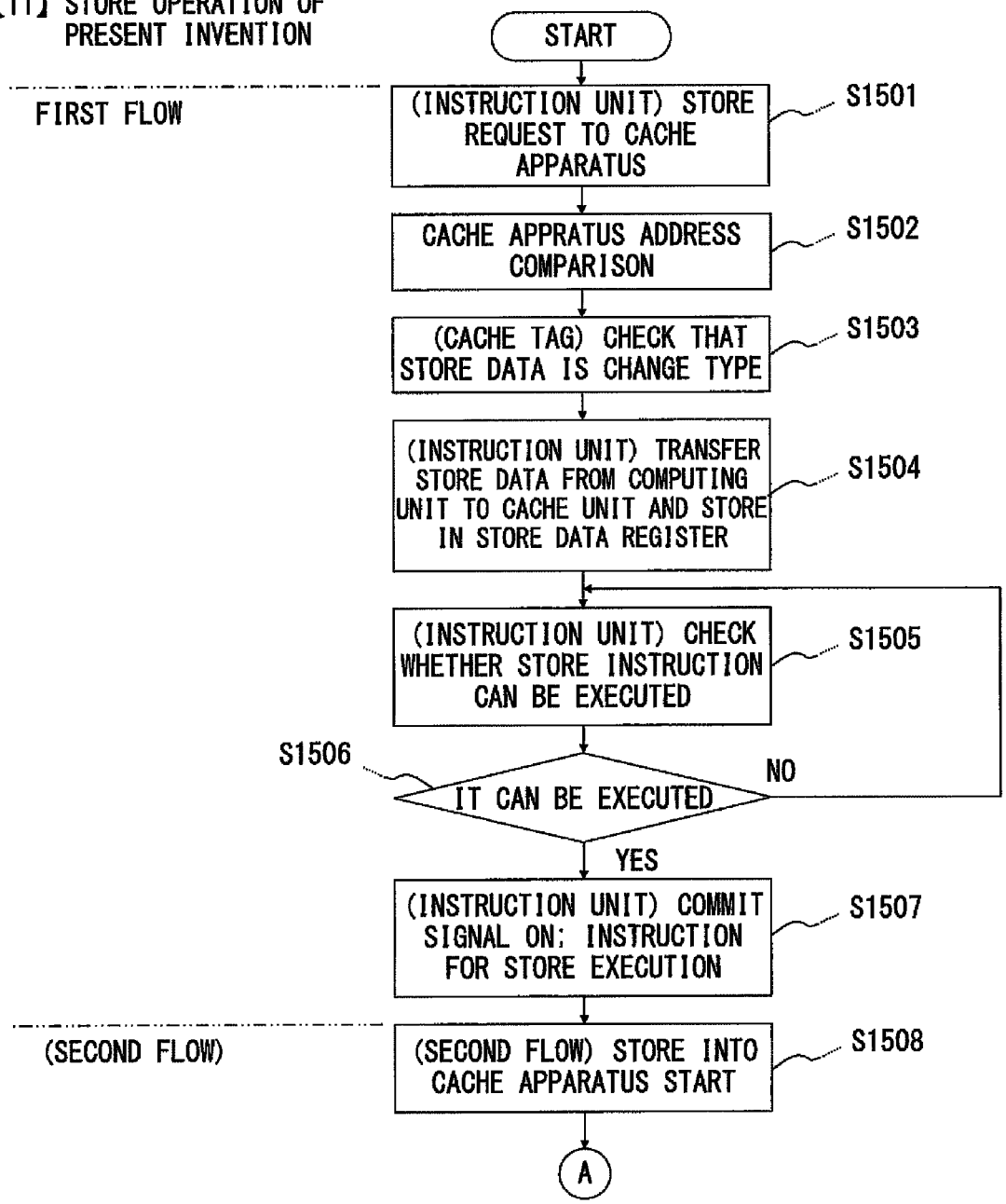
FIGS. 15A-15B are a flow diagram describing the store operation in the present embodiment.
Figure 15:
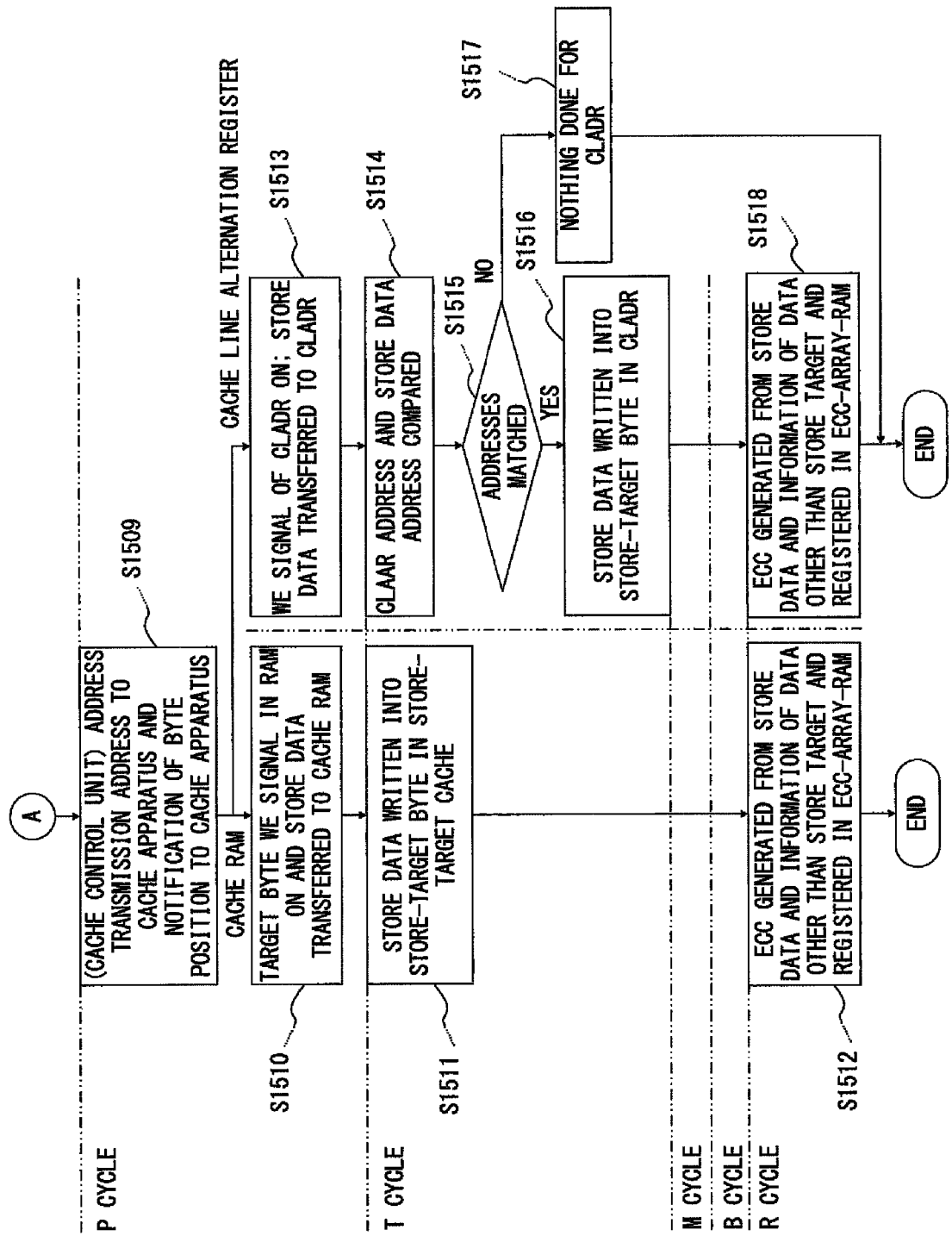

Next, the writing into the cache in response to a store instruction in the present embodiment is described in reference to FIG. 15. Also in the writing process into the cache in response to a store instruction, a reference is made once to the cache tag unit and the TLB unit, and twice to the cache data unit as in a conventional manner. In addition, in the processes in S1501-S1512 in FIG. 15, the same processes as S601-S612 being the conventional writing process into the cache in response to a store instruction in FIG. 6 are to be performed.

In FIG. 15, first, in the first process flow of the store instruction, a fault of cache data is rescued by the alternation address register 26 and the alternation data register 25 (S1501-S1507).

In the second process flow of the store instruction, while instructing the cache index address, store-target WAY and store-target byte position to the cache data unit in the P cycle (S1509), the WE (Write Enable) signal is turned ON for the store-target byte position in the store-target RAM (S1513). In parallel with it, store data stored in a store data register is taken out and sent out to the cache data unit (S1510). In the next T cycle, the store data is stored in the store-target byte position in the store-target cache RAM, while the index address and store-target WAY are compared with the contents of the alternation address register 26 and the alternation WAY register 27 (S1514). When the comparison in S1515 resulted in the match with the contents of the alternation address register 26 and the alternation WAY register 27, the store data is written into the store-target position in the alternation data register in accordance with the information indicating the store-target byte position (S1516). When the comparison in S1515 resulted in no match, nothing is written into the alternation data register 25 (S1517, the process is terminated. In the next R cycle, the ECC process is performed as in a conventional manner (S1518). By doing so, the contents of the alternation data register 25 can be updated to the latest state of the cache also in the execution of a store instruction, so when a subsequent instruction refers to a cache line to be the target of the alternation with a cache line alternation register, data corresponding to the cache data in the latest state can be taken out from the cache line alternation data register, being free from a fault from the cache.

Therefore, the cache line alternation register can be used not only in a load instruction but also in a store instruction, making it possible to avoid the performance decline that occurred in the case the store target was in the cache line alternation register.

While the present embodiment has been described as above, in the above description, the number of bits held by the alternation address register 26 is configured as illustrated in FIG. 10.

In other words, the alternation address register 26 holding the index address is configured to be composed of 9 bits indicating the access address of a faulty cache line and one-bit indicating the faulty block.

Here, the index address is increased by one bit and used to indicate the faulty block in a cache. By this, the block number to divide the cache can be doubled, and furthermore, the data size to perform the replacement of cache data can be reduced by half, making it possible to reduce the size of the alternation data register 25 by half as well.

By increasing the index address bit by bit in the same manner, it is possible to keep reducing the size of the alternation data register 25 by half. This is illustrated in FIG. 16.

First, FIG. 16A illustrates the number of bits held by the alternation address register 26 being 11 bits. A total of 11 bits: 9 bits for indicating the access address that is the line address of a faulty cache line and 2 bits for indicating the faulty block are held. By this, the number of cache blocks becomes 4 blocks, and the data size for performing the replacement of cache data becomes 16 bytes that is half of 32 bytes illustrated in FIG. 10.

In a similar manner, FIG. 16B illustrated the number of bits held by the alternation address register 26 being 12 bits, namely, 9 bits for indicating the access address and 3 bits for indicating the faulty block. By this, the number of cache blocks becomes 8 blocks, and the data size for performing the replacement of cache data can be reduced to half to 8 bytes compared to that in FIG. 16A.

Figure 16C:
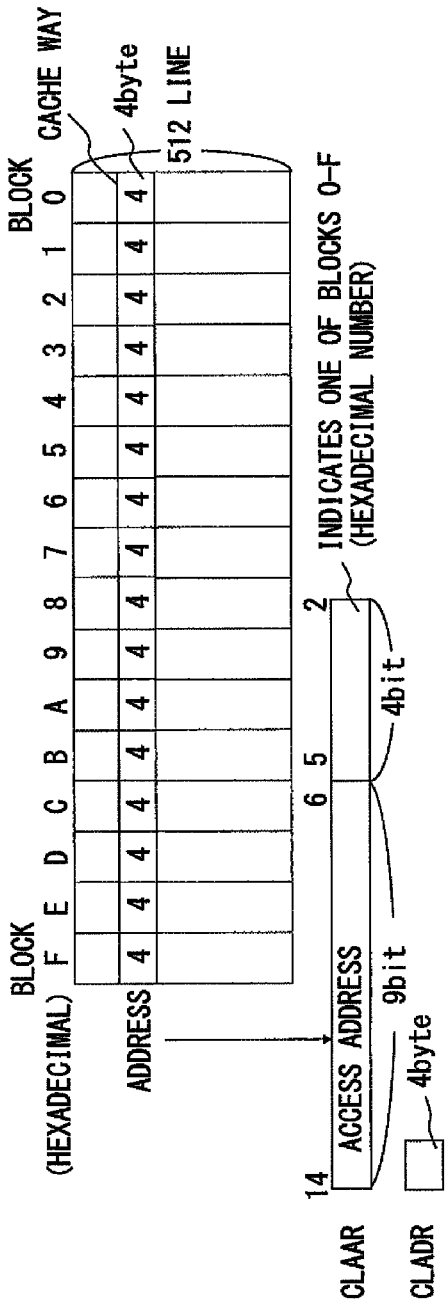
Figure 16D:
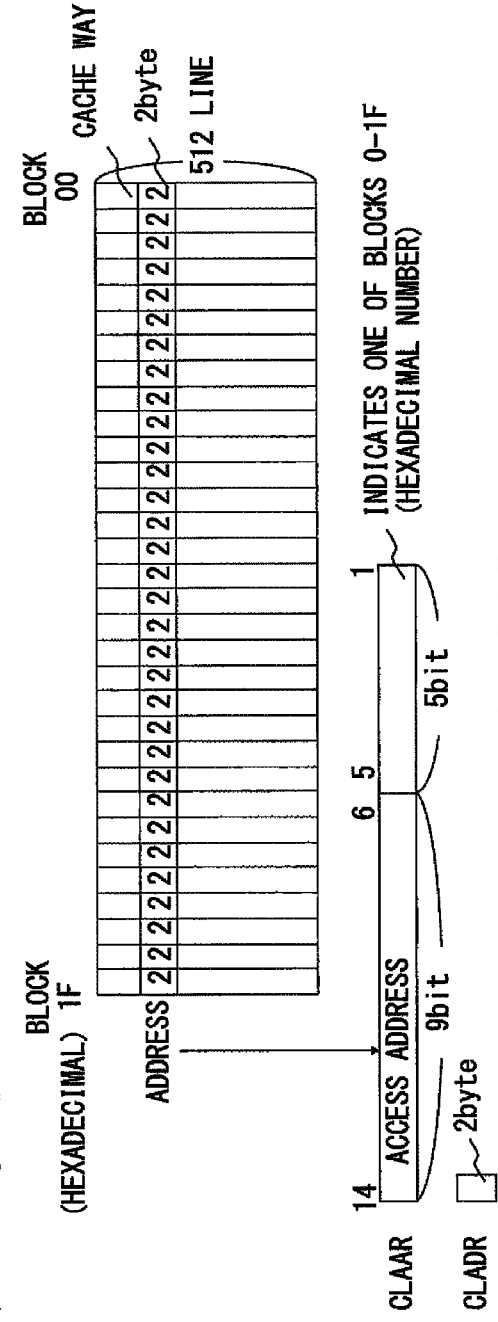

In the same manner in FIG. 16C, by increasing the number of bits held by the alternation address register 26 by one bit, the data size for performing the replacement of cache data can be reduced to half of that illustrated in FIG. 16B.

This is summarized in FIG. 17 that illustrates the quantitative relationship between the number of bits of the alternation address register 26 and the alternation data register. It can be understood that when the number of bits of the alternation address register 26 increases by one bit, the size of the alternation data is reduced by half.

Meanwhile, in the present embodiment, the update of the alternation address register 26 can be performed when a cache line is invalidated. Therefore, a mode for performing the update of the alternation address register 26 at the time of the occurrence of the cache replace (alternation) is provided. When this mode is ON, the alternation address register 26 is updated in the second flow of the replace process for invalidating the alternation-target block, with the cache index of the alternation target. By doing so, it becomes possible to update the alternation address register 26 frequently even during the normal operation. Compared to the system in which the update of the alternation address register 26 is performed only at the time of the occurrence of a permanent fault, the frequency of the update and the update timing of the alternation address register 26 increase, making it possible to easily detect a designing error with regard to the control of the alternation address register 26. Meanwhile, in S1217, S1219 in FIG. 12 and S1308 in FIG. 13, whether or not the mode is the alternation address register 26 update mode is determined.

In addition, for the cache data unit, all the cache memory cells needs to be tested upon the shipment of CPU chips. By performing the update of the alternation address register 26 also with the replacement when performing the test of the cache memory cells, it becomes possible to avoid the occurrence of a cache memory cell being missed out from the fault check by the test due to the continued protection by the alternation address register function.

Figure 18:
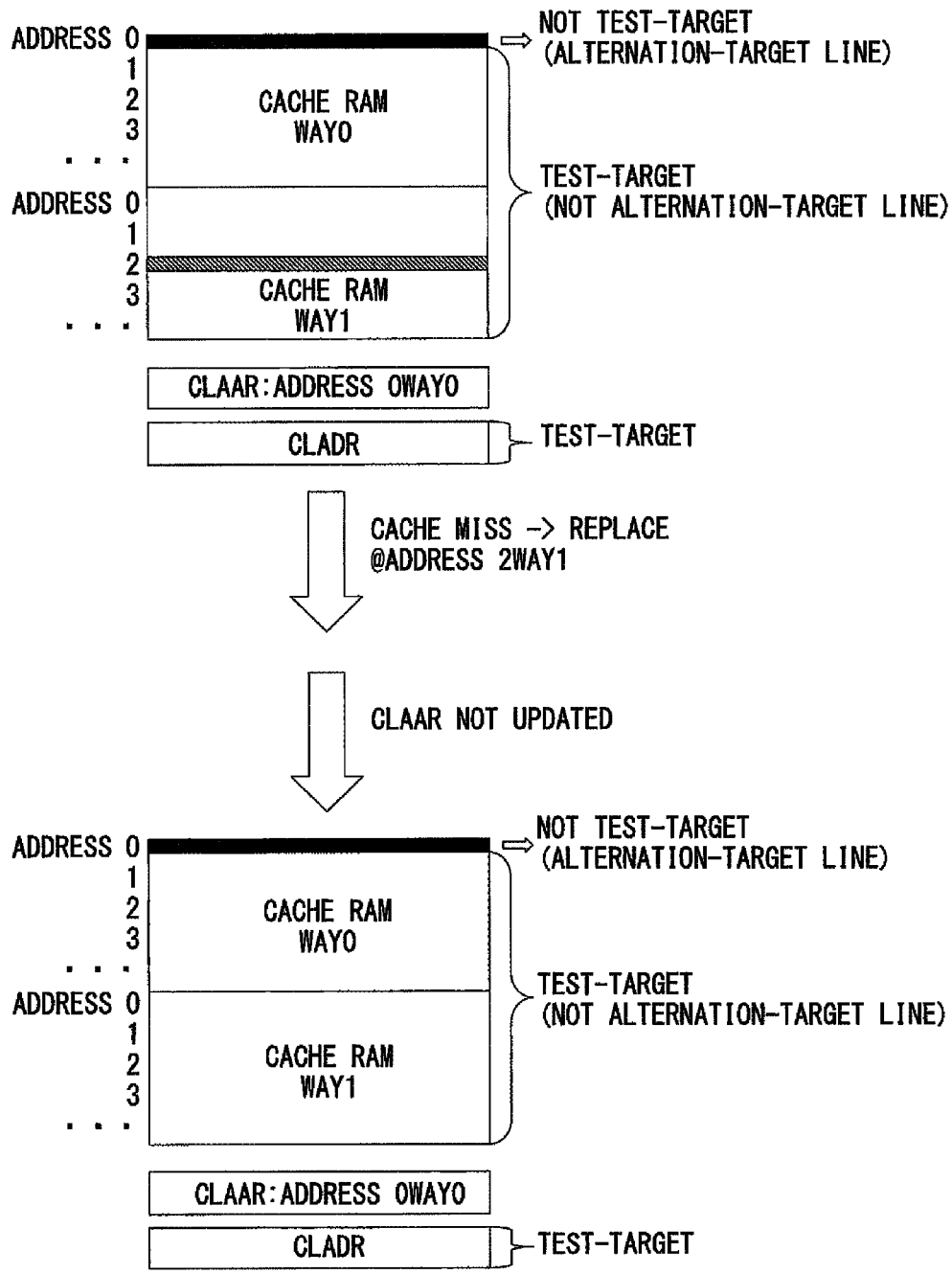
FIG. 18 is a diagram describing a process in the case in which the update mode of the alternation address register is ON in the present embodiment.
Figure 19:
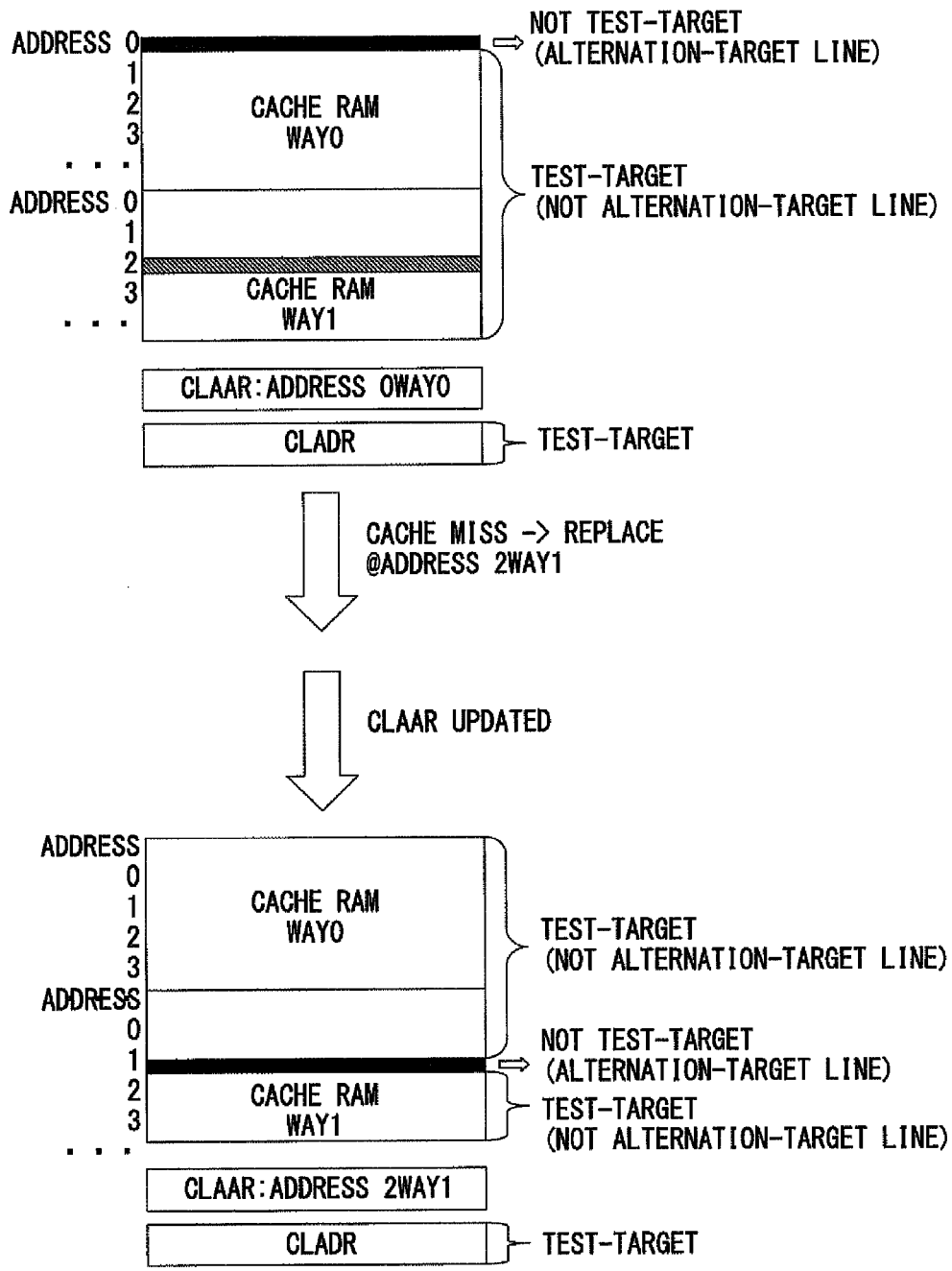
FIG. 19 is a diagram illustrating a process in the case in which the update mode of the alternation address register is OFF in the present embodiment.

For example, in the starting state of the test, if the address of the alternation address register 26 is "0WAY0", address 0, WAY 0 are set as the alternation target by the cache line alternation register unless a fault occurs. Therefore, data of the cache RAM at address 0, block 0, WAY 0 are read out while being replaced with the contents of the cache line alternation register (see the case in FIG. 18 in which the alternation address register update mode is OFF). Here, when the alternation address register update mode is turned ON, the alternation address register 26 is updated with the alternation-target cache index and cache WAY every time the replacement (alternation) is performed, making it possible to avoid the cache line at address 0, WAY 0 being missed out from the fault check (see the case in FIG. 19 in which the alternation address register update mode is ON).

While the present embodiment has been described in detail as above, the present invention is obviously not limited to the embodiment described above, and could be anything that realizes the functions equivalent to the respective configurations described above.

According to the present invention, since the index address indicating a faulty cache line in a cache memory and a data block including a faulty bit in the cache line is used for the comparison of the alternation-target addresses, the bit width of the comparison target becomes smaller than in the case in which the physical address is used, the time spend for the address comparison can be shortened, and the comparison of the alternation address can be completed before the reference result of the TLB and cache tag becomes clear. In addition, by the use of the index address, the alternation data register holding alternation data is only required to hold data that is shorter than the length of one line of a faulty cache line in which a fault has occurred. Thus, since the alternation data register is only required to hold data corresponding to the length of a data block, the circuit size used for the cache line alternation register can be reduced, and an effect of reducing the circuit implementation area and reducing the power consumption can be expected.

In addition, while the reference to the TLB and cache tag and the data writing have been performed at the same time in a conventional cache control flow, according to the cache line alternation register of the present invention, the contents of the cache line alternation register can be constantly updated to the latest state in accordance with store data while maintaining the same process flow of a store instruction as the conventional cache control flow, so the alternation resister can be used for the store instruction as well, making it possible to avoid the performance decline that occurred in the case in which the store target is in the alternation register.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A cache memory apparatus comprising:
   a data holding unit configured to include a plurality of ways that has a plurality of cache lines and to hold data in the cache lines;
   an alternation data register configured to hold data in one line of the cache lines or in a part of the cache lines held by the data holding unit;
   an alternation address register configured to hold an index address that is used for cache access and indicates a faulty cache line in which a fault has occurred in the data holding unit and a part in which the fault has occurred in the faulty cache line; and
   an address match circuit configured to compare, when an access is performed to the data holding unit, an index address used for the access and the index address held by the alternation address register,
   wherein when a read access is input into the data holding unit and the comparison by the address match circuit resulted in an address match, data read out from a way corresponding to the way information held by the alternation way register are replaced with contents of the alternation data register, to be read-out data from the data holding unit.

2. The cache memory apparatus according to claim 1, the cache memory apparatus further comprising:
   an alternation way register configured to hold information of a way in the data holding unit including a faulty bit in the data holding unit; and
   a way match circuit configured to compare, when an access is performed to the data holding unit, way information used for the access and way information held by the alternation way register,
   wherein when a write access is input into the data holding unit and the comparisons by the address match circuit and the way match circuit both resulted in an address match, data are written into a writing-in target way in the data holding unit while the data are also written into the alternation data register, matching contents of the alternation data register with a latest state of the data holding unit.

3. The cache memory apparatus according to claim 1, wherein when a faulty bit is detected in the data holding unit, writing-back of data held in a cache line including the faulty bit to a cache memory at a lower level or to a main memory are performed as needed while the cache line is invalidated, and an address of the cache line being a target of the invalidation is held in the alternation address register when the invalidation is completed, and a cache way being a target of the invalidation is held in the alternation way register.

4. The cache memory apparatus according to claim 1, wherein when an operation mode of the cache memory apparatus is a cache replace mode to perform update of the alternation address register at a time of an occurrence of a cache replace, the alternation address register and the alternation way register are updated with a cache index address and a cache way being cache-replace targets.

5. The cache memory apparatus according to claim 4, wherein the operation mode is switched to the cache replace mode not when a faulty bit appears in the data holding unit but during a normal operation, and an operation check of the alternation address register and a check of a cache memory bit are performed.

6. The cache memory apparatus according to claim 1, wherein a size of the alternation data register can be reduced by half with every one-bit increase of a number of bits indicating a data block containing a faulty bit in the cache line in the index address.

7. An execution processing apparatus having a cache memory apparatus and an execution processing unit performing execution on data held in the cache memory apparatus, the execution processing apparatus comprising:
- a data holding unit configured to include a plurality of ways that has a plurality of cache lines and to hold data in the cache lines;
- an alternation data register configured to hold data in one line of the cache lines or in a part of the cache lines held by the data holding unit;
- an alternation address register configured to hold an index address that is used for cache access and indicates a faulty cache line in which a fault has occurred and a part in which the fault has occurred in the data holding unit in the faulty cache line; and
- an address match circuit configured to compare, when an access is performed to the data holding unit, an index address used for the access and the index address held by the alternation address register,
- wherein when a read access is input into the data holding unit and the comparison by the address match circuit resulted in an address match, data read out from a way corresponding to the way information held by the alternation way register are replaced with contents of the alternation data register, to be read-out data from the data holding unit.

8. The execution processing apparatus according to claim 7, further comprising:
- an alternation way register configured to hold information of a way in the data holding unit including a faulty bit in the data holding unit; and
- a way match circuit configured to compare, when an access is performed to the data holding unit, way information used for the access and way information held by the alternation way register
- wherein when a write access is input into the data holding unit and the comparisons by the address match circuit and the way match circuit both resulted in an address match, data are written into a writing-in target way in the data holding unit while the data are also written into the alternation data register, matching contents of the alternation data register with a latest state of the data holding unit.

9. The execution processing apparatus according to claim 7, wherein when a faulty bit is detected in the data holding unit, writing-back of data held in a cache line including the faulty bit to a cache memory at a lower level or to a main memory are performed as needed while the cache line is invalidated, and an address of the cache line being a target of the invalidation is held in the alternation address register when the invalidation is completed, and a cache way being a target of the invalidation is held in the alternation way register.

10. The execution processing apparatus according to claim 7, wherein when an operation mode of the cache memory apparatus is a cache replace mode to perform update of the alternation address register at a time of an occurrence of a cache replace, the alternation address register and the alternation way register are updated with a cache index and a cache way being cache-replace targets.

11. The execution processing apparatus according to claim 10, wherein the operation mode is switched to the cache replace mode not when a faulty bit appears in the data holding unit but during a normal operation, and an operation check of the alternation address register and a check of a cache memory bit are performed.

12. The execution processing apparatus according to claim 7, wherein a size of the alternation data register can be reduced by half with every one-bit increase of a number of bits indicating a data block containing a faulty bit in the cache line in the index address.

13. A control method of a cache memory having a data holding part that has a plurality of ways that has a plurality of cache lines, an address match circuit performing comparison of addresses, a way match circuit performing comparison of the ways, and first through third registers controlling switching of cache lines, the control method comprising:
- holding data in the cache line in the data holding unit;
- holding, in the first register, data in one line of the cache lines or in a part of the cache lines held by the data holding unit;
- holding, in the second register, an index address that is used for cache access and indicates a faulty cache line in which a fault has occurred in the data holding unit and a part in which the fault has occurred in the faulty cache line; and
- comparing, by the address match circuit, when an access is performed to the data holding unit, an index address used for the access and the index address held by the second register,
- wherein when a read access is input into the data holding unit and the comparison by the address match circuit resulted in an address match, data read out from a way corresponding to the way information held by the alternation way register are replaced with contents of the first register, to be read-out data from the data holding unit.

14. The control method according to claim 13, further comprising:
- holding, in the third register, information of a way in the data holding unit including a faulty bit in the data holding unit; and
- comparing, by the way match circuit, when an access is performed to the data holding unit, way information used for the access and way information held by the third register,
- wherein when a write access is input into the data holding unit and the comparisons by the address match circuit and the way match circuit both resulted in an address match, data are written into a writing-in target way in the data holding unit while the data are also written into the first register, matching contents of the first register with a latest state of the data holding unit.

15. The control method according to claim 13, wherein when a faulty bit is detected in the data holding unit, writing-back of data held in a cache line including the faulty bit to a cache memory at a lower level or to a main memory are performed as needed while the cache line is invalidated, and an address of the cache line being a target of the invalidation is held in the second register when the invalidation is completed, and a cache way being a target of the invalidation is held in the third register.

16. The control method according to claim 13, wherein when an operation mode of the cache memory is a cache replace mode to perform update of the second register at a time of an occurrence of a cache replace, the second register and the third register are updated with a cache index and a cache way being cache-replace targets.

17. The control method according to claim 16, wherein the operation mode is switched to the cache replace mode not when a faulty bit appears in the data holding unit but during a normal operation, and an operation check of the second register and a check of a cache memory bit are performed.

* * * * *